(12) United States Patent
Sledziewski

(10) Patent No.: US 12,513,966 B1
(45) Date of Patent: Dec. 30, 2025

(54) SEMICONDUCTOR DEVICE WITH SELF-ALIGNED CHANNEL AND SELF-ALIGNED CONTACT REGION, AND METHOD OF PREPARING THE SAME

(71) Applicant: Sangdest Microelectronics (Nanjing) Co. Ltd., Nanjing (CN)

(72) Inventor: Tomasz Sledziewski, Nanjing (CN)

(73) Assignee: SANGDEST MICROELECTRONICS (NANJING) CO. LTD., Nanjing (CN)

( * ) Notice: Subject to any disclaimer, the term of this patent is extended or adjusted under 35 U.S.C. 154(b) by 0 days.

(21) Appl. No.: 18/915,352

(22) Filed: Oct. 15, 2024

(30) Foreign Application Priority Data

Sep. 19, 2024 (CN) .......................... 202411307608.9

(51) Int. Cl.
| | | |
|---|---|---|
| *H10D 64/23* | (2025.01) | |
| *H01L 21/308* | (2006.01) | |
| *H10D 12/00* | (2025.01) | |
| *H10D 12/01* | (2025.01) | |
| *H10D 30/01* | (2025.01) | |
| *H10D 30/66* | (2025.01) | |
| *H10D 62/10* | (2025.01) | |
| *H10D 62/17* | (2025.01) | |
| *H10D 62/80* | (2025.01) | |
| *H10D 62/83* | (2025.01) | |
| *H10D 62/832* | (2025.01) | |
| *H10D 62/85* | (2025.01) | |

(52) U.S. Cl.
CPC ......... *H10D 64/252* (2025.01); *H01L 21/308* (2013.01); *H10D 12/035* (2025.01); *H10D 12/461* (2025.01); *H10D 30/0295* (2025.01); *H10D 30/665* (2025.01); *H10D 62/104* (2025.01); *H10D 62/393* (2025.01); *H10D 62/114* (2025.01); *H10D 62/80* (2025.01); *H10D 62/8303* (2025.01); *H10D 62/8325* (2025.01); *H10D 62/8503* (2025.01)

(58) Field of Classification Search
CPC ....................... H10D 30/0293; H10D 30/0295
See application file for complete search history.

(56) References Cited

U.S. PATENT DOCUMENTS

| | | |
|---|---|---|
| 6,603,173 B1 | 8/2003 | Okabe |
| 8,334,541 B2 | 12/2012 | Miyahara et al. |
| 8,946,726 B2 | 2/2015 | Harris et al. |
| 9,054,131 B2 | 6/2015 | Jang |
| 9,418,992 B2 | 8/2016 | Jin et al. |

(Continued)

*Primary Examiner* — Samuel A Gebremariam
*Assistant Examiner* — Jonas T Beardsley
(74) *Attorney, Agent, or Firm* — Treasure IP Group, LLC

(57) ABSTRACT

A semiconductor device and method of making is described. A substrate (1) topped by a buffer layer (2) of a first conductivity type and one or more epitaxial layers (3) of the same type. In the topmost epitaxial layer, a body region (4) of a second conductivity type is formed, along with a source region (5) of the first conductivity type. Beneath the source region lies a buried body contact region (6) of the second conductivity type. A trench (16) in the source region provides access to the body contact region and is narrower than it. Ohmic contacts include a source contact (9) overlapping the source region on trench sidewalls and a body contact (10) overlapping the body contact region at the trench bottom. Between body regions of neighboring cells, a JFET region (13) is formed.

10 Claims, 24 Drawing Sheets

(56) References Cited

U.S. PATENT DOCUMENTS

| | | |
|---|---|---|
| 9,466,707 B2 | 10/2016 | Lai |
| 9,536,941 B2 | 1/2017 | Shore |
| 9,564,487 B2 | 2/2017 | Hsiao et al. |
| 9,620,640 B2 | 4/2017 | Hung et al. |
| 9,735,266 B2 | 8/2017 | Kalnitsky et al. |
| 9,947,770 B2 | 4/2018 | Li et al. |
| 10,068,977 B2 | 9/2018 | Lin et al. |
| 10,297,594 B2 * | 5/2019 | Lee .................. H10D 30/0293 |
| 10,446,679 B2 | 10/2019 | Bobde et al. |
| 10,461,174 B1 | 10/2019 | Chi et al. |
| 10,529,567 B2 | 1/2020 | Yan |
| 10,680,067 B2 | 6/2020 | Tang et al. |
| 10,686,070 B2 | 6/2020 | Shi et al. |
| 10,998,438 B2 | 5/2021 | Yilmaz |
| 11,251,177 B2 | 2/2022 | Takano et al. |
| 11,437,510 B2 | 9/2022 | Xiao et al. |
| 11,444,192 B2 | 9/2022 | Schöner et al. |
| 11,476,369 B2 | 10/2022 | Konstantinov |
| 11,728,422 B2 | 8/2023 | Magri' et al. |
| 2010/0148245 A1 * | 6/2010 | Loechelt .............. H10D 62/157 257/E29.262 |
| 2011/0062489 A1 * | 3/2011 | Disney .................. H10D 62/83 257/E29.198 |
| 2012/0267704 A1 | 10/2012 | Siemieniec et al. |
| 2013/0240981 A1 | 9/2013 | Hutzler et al. |
| 2014/0159149 A1 | 6/2014 | Hsieh |
| 2020/0020533 A1 * | 1/2020 | Chan .................. H10D 12/031 |
| 2023/0299140 A1 | 9/2023 | Honjo |

\* cited by examiner

SEMICONDUCTOR DEVICE WITH SELF-ALIGNED CHANNEL AND SELF-ALIGNED CONTACT REGION, AND METHOD OF PREPARING THE SAME

CROSS REFERENCE TO RELATED APPLICATION

This application claims priority to a Chinese Application No. 2024113076089, filed on Sep. 19, 2024, entitled "SEMICONDUCTOR DEVICE WITH SELF-ALIGNED CHANNEL AND SELF-ALIGNED CONTACT REGION, AND METHOD OF PREPARING THE SAME". Both the Chinese applications are incorporated herein by reference in its entirety.

FIELD OF THE INVENTION

The present invention relates to the field of semiconductor devices or transistors, specifically to a semiconductor structure using self-aligned fabrication process steps to achieve reduced cell pitch and process complexity, in particular, a Metal-Oxide-Semiconductor Field-Effect Transistor (MOSFET) and an Insulated Gate Bipolar Transistor (IGBT), and a method of making the same.

Power semiconductor devices are typically designed as integrated circuits consisting of thousands of identical elementary cells connected in parallel. The overall device resistance is inversely proportional to the number of cells, meaning that reducing the size of these cells to achieve larger-scale cell integration is a natural progression in device evolution. A key technological process which determines cell integration is photolithography, which is defined by its critical parameters: resolution and overlay accuracy. Although the photolithography has inherent limitations due to these parameters, these can sometimes be surpassed through the application of self-aligned processes. The self-aligned processes not only enable feature sizes beyond the limits of the photolithography but also can lower the manufacturing cost and improve the device yield.

Among the most widely used power semiconductor devices is the Metal-Oxide-Semiconductor Field-Effect Transistor (MOSFET), initially developed in a silicon (Si) technology. Recently, power MOSFETs have also become commercially available in a silicon carbide (SiC) technology. Silicon carbide is a wide-bandgap semiconductor which provides significant benefits for power electronics, particularly in terms of electrical and thermal performance. While the fabrication process for SiC devices shares similarities with that for Si devices, the SiC technology possesses some unique characteristics. Specifically, SiC microfabrication necessitates high-temperature processing, such as implantation annealing at approximately 1700° C., thermal oxidation at about 1300° C., and contact annealing at around 1000° C. These high-temperature requirements, coupled with the limited diffusion of dopants in SiC, render the SiC fabrication process not entirely compatible with the Si device fabrication. Consequently, the development of dedicated device fabrication processes, including the self-aligned processes, is essential for the silicon carbide technology.

The semiconductor industry has long sought advancements in the reliability and performance of silicon carbide MOSFET structures. One of key requirements from a device is its reliable operation in forward and blocking states, which, among others, requires the integration of a body contact region and an ohmic body contact in the device structure.

Traditionally, the body and source contacts are shorted using top metallization. During the forward and blocking state operation, the source and body contacts are negatively biased relatively to the drain. This configuration results in the body region being negatively biased relatively to the drift layer, effectively keeping a parasitic body diode within the MOSFET structure in the blocking state, as illustrated in FIG. 22.

Without a suitable body contact process and a highly doped body contact region, there is a risk of triggering the parasitic body diode, which can for example lead to early breakdown in the blocking state. However, the integration of the body contact region and the body contact increases the cell pitch, making the cell integration smaller and the device resistance higher.

The optimization of a trade-off between the reliability and device resistance has led to the development of this improved semiconductor structure. The invention ensures reliable and energy-efficient device operation in various power electronics applications.

SUMMARY OF THE INVENTION

The invention introduces a novel semiconductor structure which features a reduced cell pitch, allowing for a higher density of cells within an integrated device. This increased cell density leads to lower device resistance and reduced power losses, or it enables reduction of the semiconductor area used for device fabrication, which is especially beneficial in the context of the expensive silicon carbide technology.

The semiconductor structure comprises a body region, a source region, and a body contact region, wherein the source region is self-aligned with the body region and the body contact region is self-aligned with the body region. The body contact region is located beneath the source region and is electrically accessible via a trench etched into the source region. The self-alignment ensures that the widths of the source and body contact regions are identical. A self-aligned ohmic metal is used to form ohmic source and body contacts on the trench bottom and sidewalls. This innovative approach results in a structure with a significantly reduced cell pitch and lower resistance. In addition, this approach enables using fewer fabrication steps and smaller semiconductor area, thus lowering the final device cost.

By employing three self-aligned processes, having a source region self-aligned with a body region, a body contact region self-aligned with the body region and a self-aligned ohmic metal, the invention simplifies the fabrication process and enhances the production of more compact and cost-effective silicon carbide devices. These advancements have the potential to decrease the cost and size of end applications while promoting greater energy savings.

On a first aspect of the invention, a process of making a semiconductor structure is disclosed. The process comprises forming a source region self-aligned with a body region to create a self-aligned channel; forming a body contact region self-aligned with the body region; forming self-aligned ohmic contacts; wherein body contact region is buried below the source region; the source region is split in two parts by trench etching in order to access the buried body contact region; a source contact is overlapping the source region on trench sidewalls and a body contact is overlapping the body contact region on trench bottom alone or on trench bottom and sidewalls; and no source and body contacts are present on top semiconductor surface.

One embodiment presents a method to make a semiconductor device having a source region self-aligned with a body region and having a body contact region self-aligned with the body region, comprising the following steps:

providing a semiconductor substrate;

depositing a semiconductor buffer layer of the first conductivity doping type on the semiconductor substrate;

depositing one or more semiconductor epitaxial layers of the first conductivity doping type on the buffer layer and forming a drift layer;

forming through depositing or growing a thin layer (M0) on a topmost epitaxial layer, wherein the said thin layer (M0) is configured to adjust profiles of implanted ions and to protect the topmost epitaxial layer;

depositing and patterning a first hard mask material to produce a first hard mask (M1), wherein the first hard mask has a thickness to block the implanted ions;

forming a body region of a second conductivity doping type by ion implantation, using the first hard mask (M1) as a mask; and forming junction field effect transistor (JFET) regions between the body regions of neighboring cells; wherein the second conductivity doping type has a polarity opposite to the first conductivity type;

depositing a second hard mask material on top of the first hard mask (M1) and the thin layer (M0);

etching the second hard mask material to create a second hard mask (M2) as a spacer mask on sidewalls of the first hard mask (M1);

forming a source region of the first conductivity doping type by ion implantation, using the first hard mask (M1) and the second hard mask (M2), making the source region self-aligned with the body region, creating a channel between the JFET region and the body region and the source region at shallow depths the body region;

forming a body contact region of the second conductivity doping type by ion implantation, using the first hard mask (M1) and the second hard mask (M2), making the body contact region self-aligned with the body region and with the source region;

removing the thin layer (M0), the first hard mask (M1) and the second hard mask (M2) by wet etching or dry etching with high selectivity to the semiconductor material;

etching an ohmic contact via in the interlayer dielectric using a contact mask and using the same contact mask to etch a trench in the source region to access the body contact region;

removing the contact mask and depositing an ohmic metal layer on top and sidewalls of the interlayer dielectric and on bottom and sidewalls of the semiconductor trench;

annealing the ohmic metal using a first contact annealing process to form a self-aligned metal and semiconductor alloy on the trench bottom and sidewalls;

removing the unalloyed ohmic metal from the interlayer dielectric and semiconductor, leaving the metal and semiconductor alloy intact, and annealing the metal and semiconductor alloy using a second contact annealing process to achieve final properties of ohmic contacts; source contact defined by an overlap of the alloy with the source region on the sidewalls of the semiconductor trench, body contact defined by an overlap of the alloy with the body contact region on the bottom of the semiconductor trench.

The method further comprises steps of activating the implanted ions, forming a gate insulator, forming a gate and forming an interlayer dielectric enclosing the gate; processing the semiconductor device, including etching a gate contact via, depositing and patterning front side metallization, depositing and patterning passivation, and forming backside metallization.

On a second aspect, a semiconductor structure is disclosed, which is made using the invented device fabrication method.

The semiconductor structure can be used in a Metal-Oxide-Semiconductor Field-Effect Transistor (MOSFET) and in an Insulated Gate Bipolar Transistor (IGBT).

In one embodiment, the semiconductor device comprises a substrate (1); a buffer layer (2) formed on the substrate; one or more epitaxial layers (3) formed on top of the buffer layer; a body region (4), formed in one or more epitaxial layers (3); a source region (5), formed within the body region (4); a body contact region (6) buried below the source region (5); a trench (16) formed in the source region (5) making an electrical access to the body contact region (6), a source contact (9) being an ohmic contact overlapping the source region on a trench sidewall, a body contact (10) being an ohmic contact overlapping the body contact region (6) on a trench bottom; wherein between the body regions (4) of the neighboring cells is formed a Junction Field-Effect Transistor (JFET) region (13); wherein between the JFET region (13) and the source region (5) at a shallow depth in the body region (4) is formed a self-aligned channel (14), which opens an electrical current path between a source electrode and drain electrode; and wherein widths of the source region (5) and the body contact region (6) are the same.

DESCRIPTION OF DRAWINGS

In order to further illustrate the technical solutions of embodiments of the present disclosure, various embodiments of the present disclosure will be described in detail below with reference to the accompanying drawings. In the illustrated drawings, the elements are a substrate (1);
a buffer layer (2);
one or more more epitaxial layers (3);
a body region (4);
a source region (5);
a body contact region (6);
a gate insulator (7);
a gate (8);
a source contact (9);
a body contact (10);
an interlayer dielectric (11);
top metallization (12);
a JFET region between the body regions of neighboring cells (13);
a self-aligned channel (14) between the source region (5) and the JFET region (13) at a shallow depth in the body region (4)
bottom metallization (15);
a thin layer (M0);
a first hard mask (M1);
a second hard mask (M2);
a source electrode (S);
a drain electrode (D); and
a gate electrode (G).

FIG. 18 is a schematic illustration of forming a first hard mask (M1) on top of a thin layer (M0), along with a selective implantation of a body region (4), to produce the comparative semiconductor device.

FIG. 19 is a schematic illustration of depositing the second hard mask material on top of the first hard mask (M1) and thin layer (M0), to produce the comparative semiconductor device.

FIG. 20 is a schematic illustration of etching the second mask material to form a second hard mask (M2) on the sidewalls of the first hard mask, along with the ion implantation of the source region (5) self-aligned with the body region (4), to produce the comparative semiconductor device.

FIG. 21 is a schematic diagram illustrating the implantation of the body contact region (6), to produce the comparative semiconductor device.

FIG. 22 is a schematic illustration showing the presence of a parasitic body diode in a device structure and polarization of the electrical voltage over the diode in forward and blocking states for an n-type device.

DESCRIPTION OF EMBODIMENTS

Figure 1:
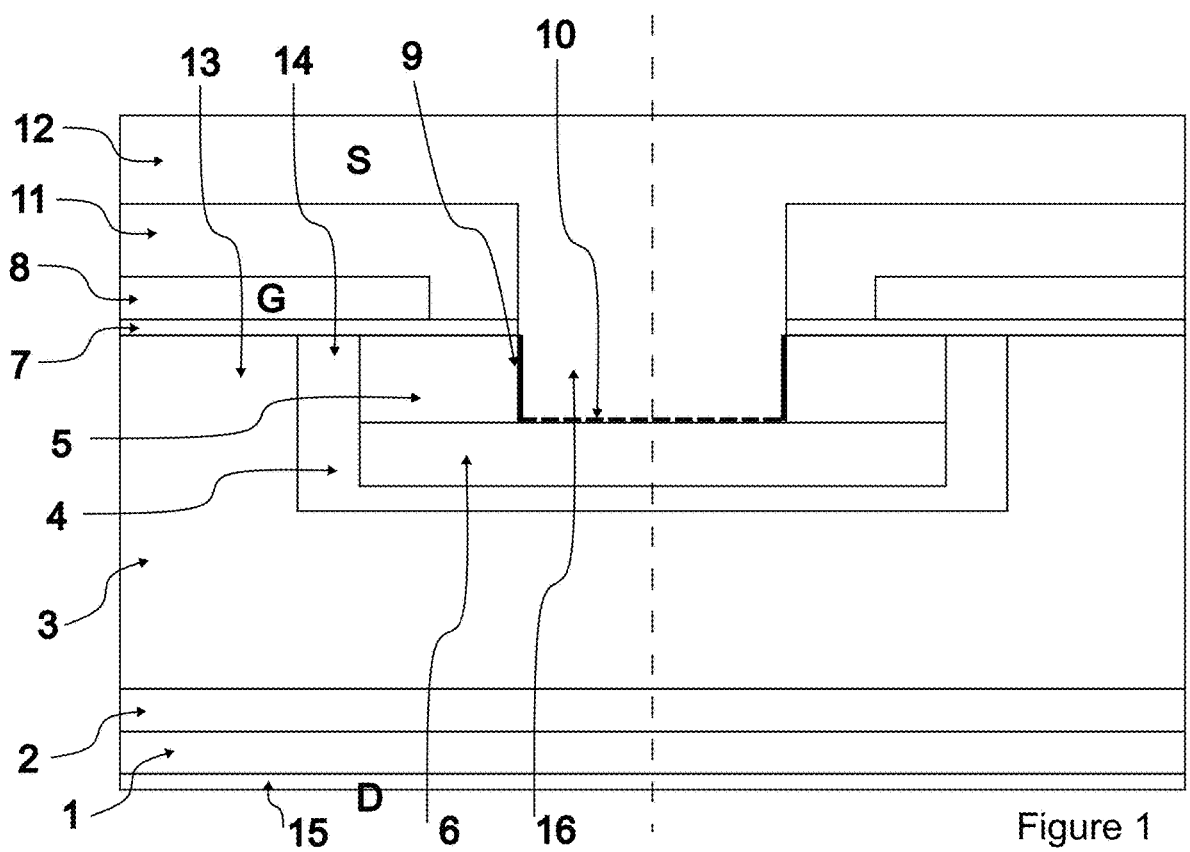
FIG. 1 is a schematic diagram depicting a cross-sectional view of a device structure of the present invention.

One object of the invention is to present a device elementary cell with a reduced pitch, enabling a higher density of cells within an integrated device. This increased cell integration results in reduced device resistance and power losses. Alternatively, it allows for the usage of a smaller semiconductor area in device fabrication, reducing the overall device cost, which is particularly beneficial for expensive silicon carbide technology.

The invention incorporates three self-aligned processes for the formation of a channel, a body contact region and an ohmic contact, which reduces the number of fabrication steps and lowers the device manufacturing cost.

The term "self-aligned channel process" refers to a technique where the source and body regions of a transistor are aligned with each other utilizing just one and the same photolithography mask.

The term "hard mask" refers to a mask produced from a material which can withstand processing at elevated temperatures, typically the temperatures above the graphitization point of organic layers, e.g. a photoresist. The common materials are silicon nitride, silicon dioxide and polysilicon.

The terms "M1" and "M2" refer to specific masks used in the process.

The term "contact mask" indicates a mask used specifically for creating the contacts, which are the regions touching the semiconductor and having the electrical connection with a source electrode.

Further the semiconductor device structure made using the process disclosed in the present invention is characterized by the body contact region buried below the source region; the source region i-split in two parts by a trench in order to access the buried body contact region; the source contact overlapping the source region on trench sidewalls and the body contact overlapping the body contact region on trench bottom or on trench bottom and sidewalls and no source and body contacts on top semiconductor surface.

The invention can be applied to fabrication of semiconductor devices, e.g. MOSFET, IGBT, Superjunction MOSFET. The invention can be applied to different semiconductor materials, e.g. silicon carbide, silicon, gallium nitride, gallium oxide and aluminum nitride. The invention can be applied to semiconductor devices using a different shape of elementary cell, e.g. stripes, squares and hexagons. Power devices using the invention find an application in energy conversion. Typical power electronics applications, which may benefit from the invention, are electric vehicle (EV) traction inverter, EV charger and EV on-board charger, data center, motor drives, rolling stock inverters, solar inverters, consumer power electronics.

In accordance with the first aspect of the invention, a method to make a semiconductor device is disclosed.

The method disclosed herein is a multistep process. The description provided is intended to thoroughly explain the invention, but it does not imply that the invention must include all the steps described. Individual steps or groups of steps can be used independently or in combination with other steps to achieve the desired outcome, depending on the specific application or embodiment of the invention. This flexibility allows the invention to be adapted to various contexts while maintaining its core functionality and benefits.

1. Providing a Substrate

Referring to FIGS. 1-7, the method comprises a step, or step 1, of providing a semiconductor substrate; the substrate is selected from silicon carbide, silicon, gallium nitride, gallium oxide, aluminum nitride or another semiconductor material. The conductivity doping type for the substrate can be either an n-type doping or a p-type doping.

In one embodiment, wherein the semiconductor substrate has a first conductivity doping type; the substrate is selected from silicon carbide, silicon, gallium nitride, gallium oxide, aluminum nitride or another semiconductor material. The first conductivity doping type for the substrate can be either an n-type doping or a p-type doping. In one instance, the first conductivity doping type is n-type doping. In another instance, the first conductivity doping type is p-type doping.

In the scope of the present invention, n-type doping involves adding elements that have more valence electrons than the semiconductor material (e.g., phosphorus, arsenic in silicon), resulting in an excess of free electrons, which are the majority charge carriers. This makes the semiconductor conductive by electrons.

In the scope of the present invention, p-type doping involves adding elements that have fewer valence electrons than the semiconductor material (e.g., boron, aluminum in silicon), creating "holes" (absence of electrons) which act as positive charge carriers. This makes the semiconductor conductive by holes.

2. Forming a Buffer Layer

The next step, step 2 of the method, comprises depositing a semiconductor buffer layer of the first conductivity doping type onto the substrate. This deposition is carried out using homoepitaxy, meaning that the substrate and the buffer layer are composed of the same material.

3. Depositing One or More Semiconductor Epitaxial Layers

Following that, step 3 of the method comprises depositing one or more semiconductor epitaxial layers of the first conductivity doping type onto the buffer layer. This deposition is also performed using homoepitaxy, ensuring that the buffer layer and the epitaxial layers are made of the same material. The layer that bears the majority of the blocked voltage is referred to as the drift layer. In the scope of the present invention, the method comprises depositing a substrate, a semiconductor buffer layer and one or more epitaxial layers of the same material.

4. Growing a Thin Layer (M0)

Another step, or the step 4, of the method is depositing or growing a thin layer (M0) on a topmost epitaxial layer; wherein the said thin layer (M0) is configured to adjust profiles of implanted ions, for example to scatter the implanted ions or to set a peak dopant concentration at near-surface depths; and to protect the topmost epitaxial layer during patterning the masks M1 and M2.

5. Patterning the First Hard Mask Material to Produce a First Hard Mask (M1)

A further step, or the step 5, of the method is depositing and patterning the first hard mask material to produce a first hard mask (M1); the first hard mask material can be for example silicon dioxide, silicon nitride, polysilicon, or any combination of them; the thickness of the deposited hard mask material must be chosen to block the implanted ions; the first hard mask (M1) is produced by patterning the first hard mask material, typically by the photolithography and dry etching.

6. Forming the Body Region of the Second Conductivity Doping Type

A further step, or the step 6, of the method is using the first hard mask (M1) as a mask to form the body region of the second conductivity doping type by ion implantation. The regions between the body regions are named the JFET (Junction Field-Effect Transistor) regions. In contrary to a photoresist mask, a hard mask enables processing at elevated temperatures, e.g. the ion implantation (typically around 500° C.) or deposition of another layer on top of the mask. Furthermore, a range of implanted ions in a hard mask is typically smaller than in a photoresist mask, which enables usage of higher ion implantation energies.

7. Depositing a Second Hard Mask Material on Top of the First Hard Mask (M1)

A further step, or the step 7, of the method is depositing a second hard mask material on top of the first hard mask (M1) and the thin layer (M0). The first hard mask material can be for example silicon dioxide, silicon nitride, polysilicon, or my combination of them. A variety of processes, which could be used for the deposition, includes, but is not limited to LPCVD (low pressure chemical vapor deposition) and PECVD (plasma enhanced chemical vapor deposition). In one preferred embodiment, LPCVD is used, which offers good layer thickness conformity. It means that the thickness of the deposited second hard mask material is substantially the same on the top (mesa) of the hard mask M1, on the top of the layer M0 (bottom of trench-etched in the hard mask M1) and on the sidewalls of the hard mask M1.

8. Etching the Second Hard Mask Material to Create a Second Hard Mask (M2)

Figure 5:
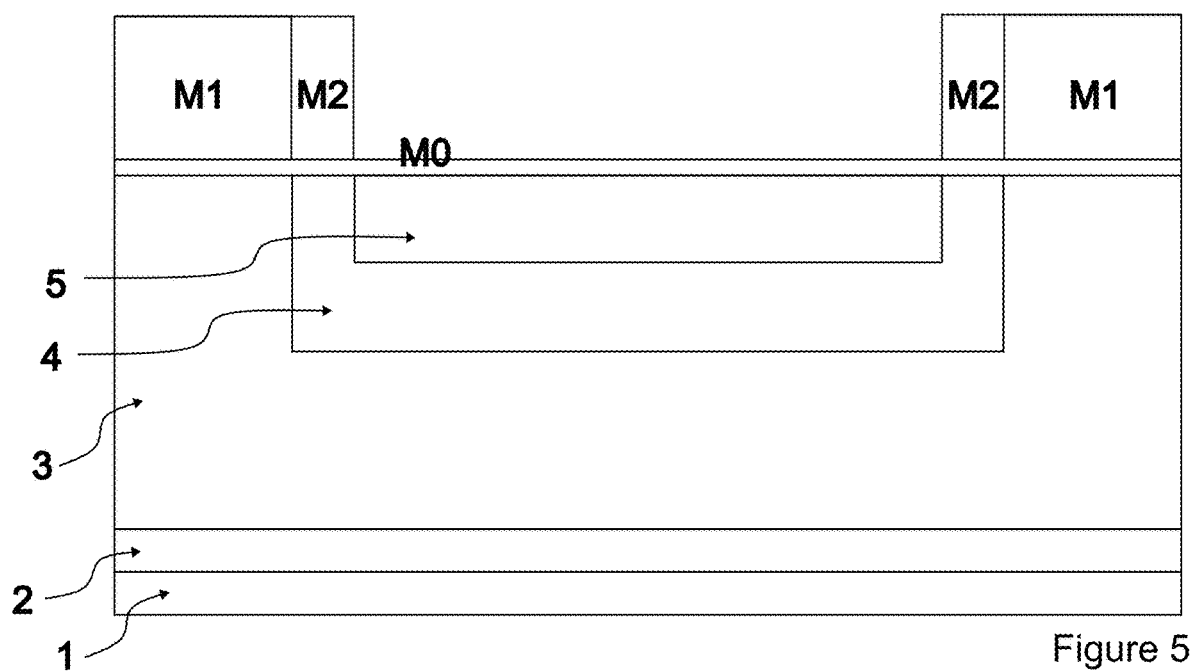
FIG. 5 is a schematic illustration of etching the second hard mask material to form a second hard mask (M2) on sidewalls of the first hard mask, along with the implantation of a source region (5) of the first conductivity doping type self-aligned with the body region (4).

Referring to FIG. 5, a further step, or step 8, of the method is etching the second hard mask material to create a second hard mask (M2) on the sidewalls of the first hard mask. This process is a spacer formation process. The spacer mask (the second hard mask M2) is formed on the sidewalls of the first hard mask M1, while the second hard mask material is removed from the top of the first hard mask M1 and from the top of the layer M0. Upon using a LPCVD for the second hard mask material deposition, the width of the spacer is precisely controlled in a manner that the width of the spacer equals the thickness of the deposited second hard mask material.

9. Forming a Source Region

Referring to FIG. 5, a further step, or step 9, of the method is forming a source region of the first conductivity doping type by ion implantation, using the first hard mask (M1) and the second hard mask (M2), making the source region self-aligned with the body region, creating a channel between the JFET region and the source region at a shallow depth in the body region. The channel length is defined by and equal to the spacer width, therefore comprising controlling a width of the spacer by controlling a thickness of the deposited second hard mask material, controlling the channel length by the spacer width.

10. Forming a Body Contact Region

Figure 6:
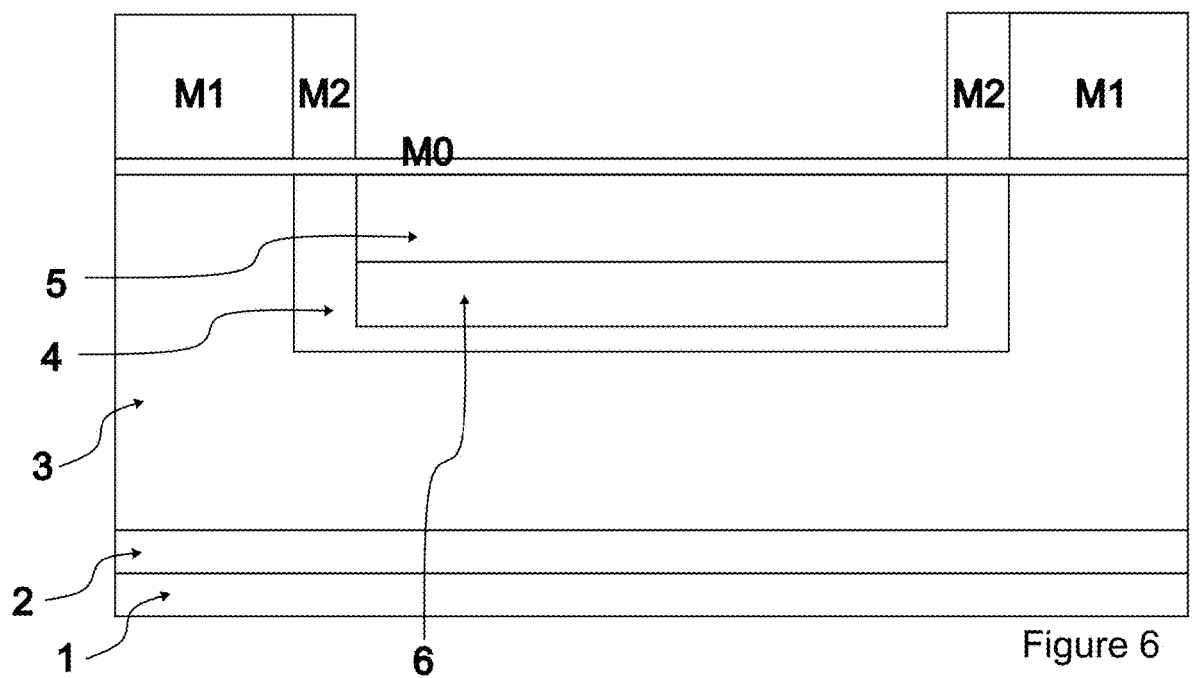
FIG. 6 is a schematic illustration of using the first and second hard masks (M1 and M2) as masks for the implantation of a body contact region (6) of the second conductivity doping type self-aligned with the body region (4) and the source region (5).

Referring to FIG. 6, a further step, or step 10, of the method is forming a body contact region of the second conductivity doping type by ion implantation, using the first hard mask (M1) and the second hard mask (M2), making the body contact region self-aligned with the body region and with the source region; the body contact region is self-aligned on the source region, so it is also self-aligned on the body region. The width of the body contact region is inherited or substantially the same as the width of the source region due to using the same masks M1 and M2 for the ion implantation. The only little difference in width of both regions could be due to different lateral scattering of the opposite conductivity doping type ions implanted with different energies and doses. The implantation energy and dose for the body contact region must be chosen in order to bury that region below the source region and not to affect the electrical properties of the source contact on the source region.

11. Removing all the Masks and Layers M2, M1 and M0

Figure 7:
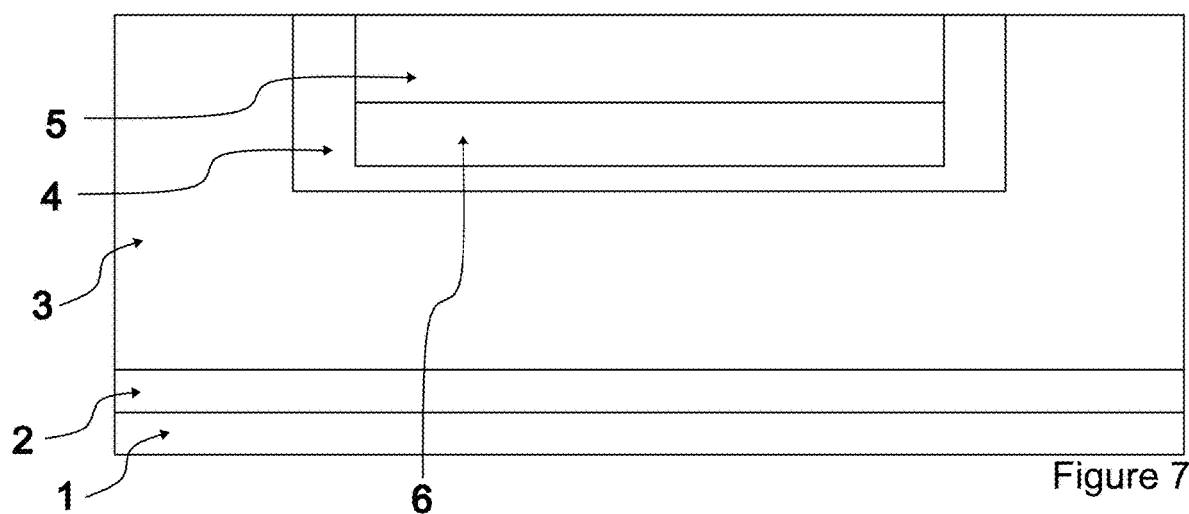
FIG. 7 is a schematic illustration of a structure formed after the removal of all masks, M0, M1 and M2.

A further step, or step 11, of the method is to remove all the masks and layers M2, M1 and M0, as depicted in FIG. 7. The masks are removed by wet etching or dry etching with very high selectivity to the semiconductor material.

12. Continuing a Standard FET Process Flow

Figure 8:
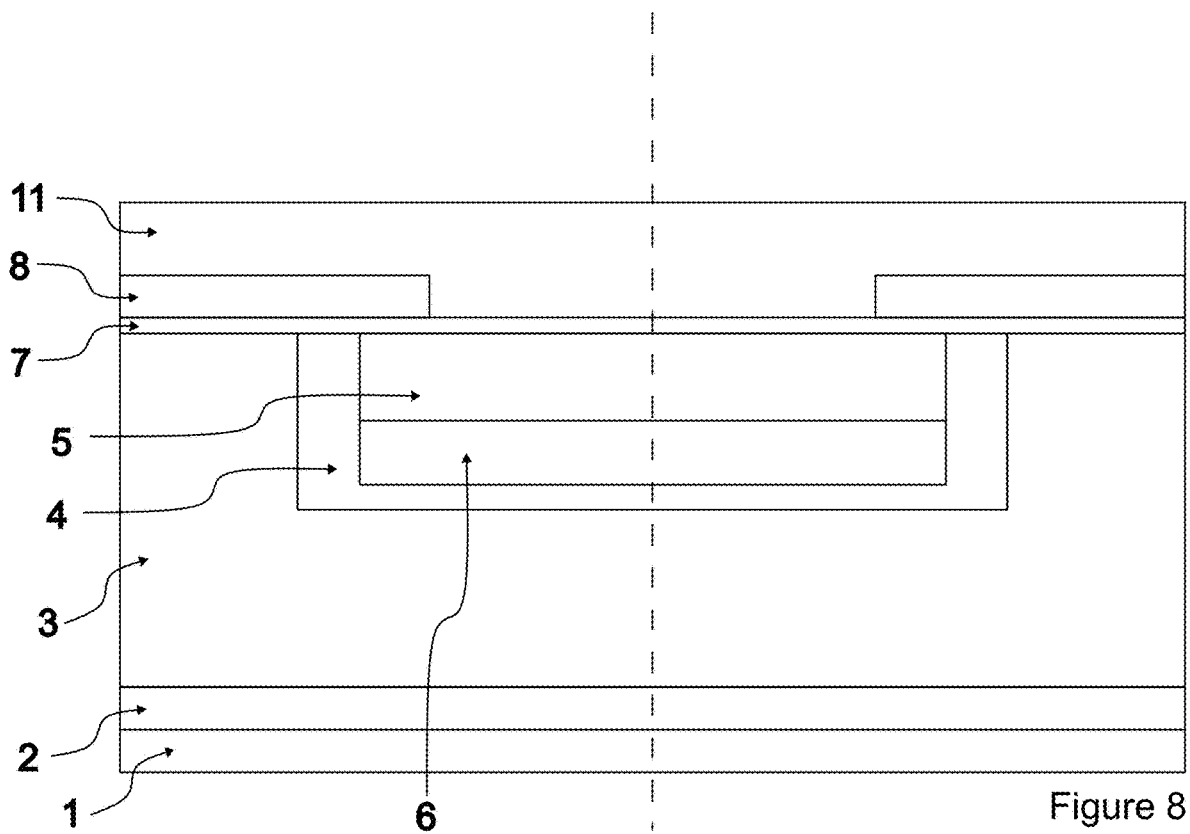
FIG. 8 is a schematic diagram depicting a cross-sectional view of a device after the formation of a gate insulator (7), a gate (8), and an interlayer dielectric (11) enclosing the gate.
Figure 9:
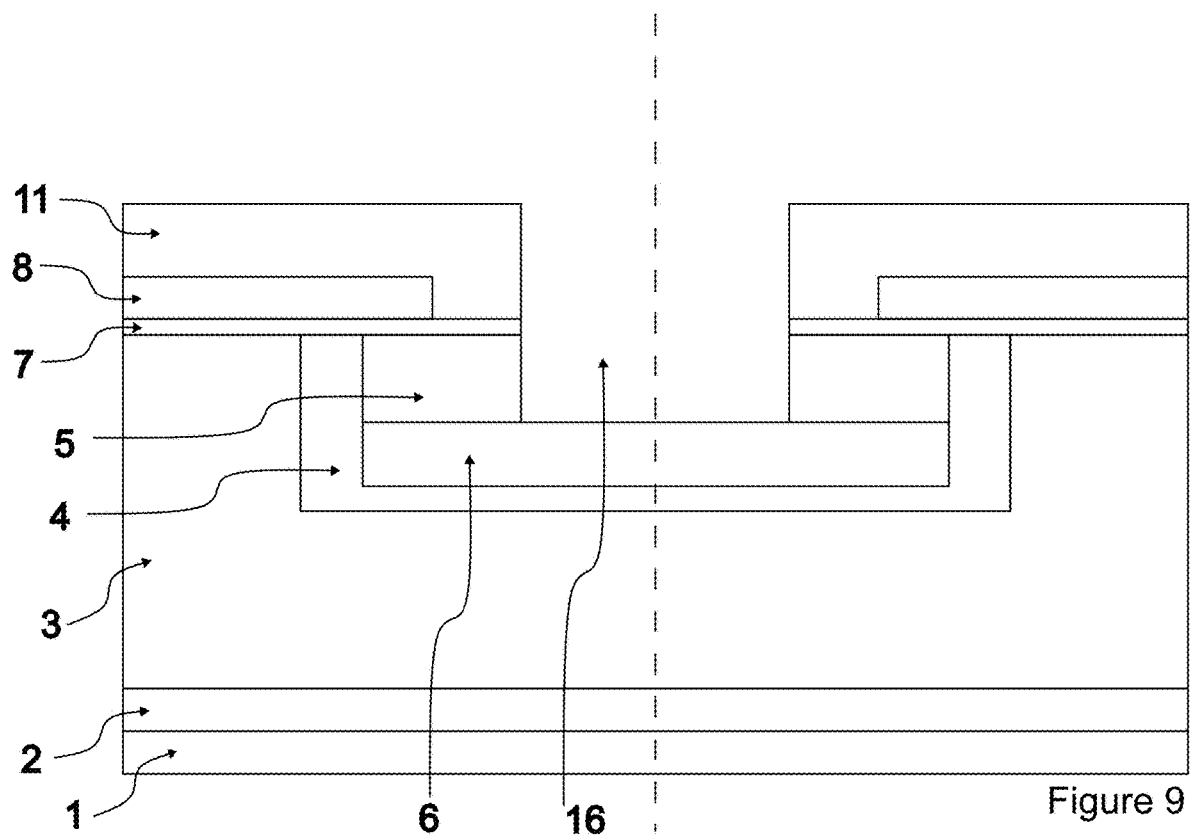
FIG. 9 is a schematic illustration of etching an ohmic contact via in the interlayer dielectric (11) and further etching a trench (16) in the source region (5) to access the body contact region (6).

Another further step, or step 12, of the method is to continue the process according to a standard FET (Field-Effect Transistor) process flow, including steps such as post-implantation annealing, formation of an active area oxide, formation of gate insulator (7), formation of a gate (8), and deposition of an interlayer dielectric (11), as shown in FIG. 8.

13. Etching an Ohmic Contact Via and Etching a Trench in the Source Region

Another further step, or step 13, of the method is to etch an ohmic contact via using a contact mask and use the same contact mask to etch a trench in the source region to access the body contact region. The trench is narrower than the body contact region, along the lateral direction of the cell, opposite to the etching direction or the depth direction of the cell.

14. Deposition of Ohmic Metal

Figure 10:
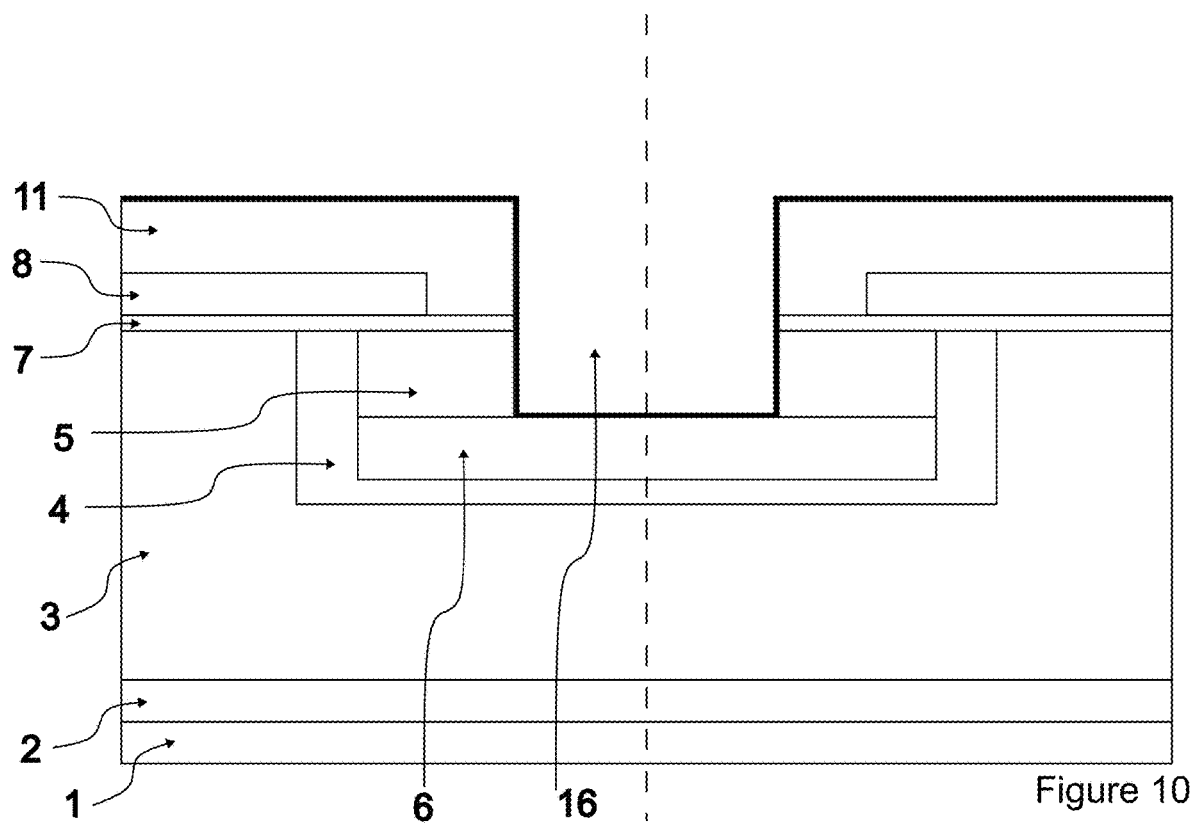
FIG. 10 is a schematic diagram depicting a cross-sectional view of a device structure with a deposited ohmic metal layer on top and sidewalls of the interlayer dielectric (11) and on bottom and sidewalls of the semiconductor trench (16).
Figure 11:
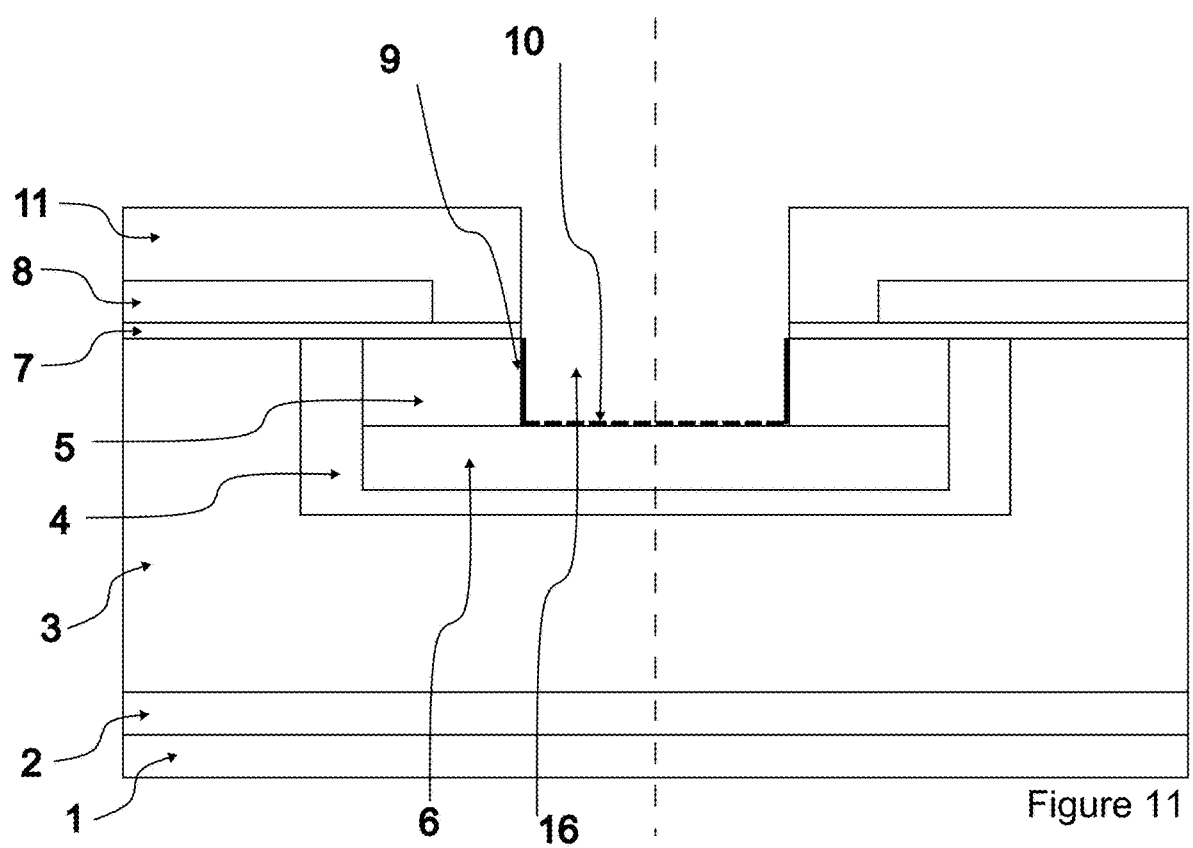
FIG. 11 is a schematic illustration of forming a source contact (9) on the source region (5) on the sidewalls of the semiconductor trench (16) and forming a body contact (10) on the body contact region (6) on the bottom of the semiconductor trench (16).
Figure 12:
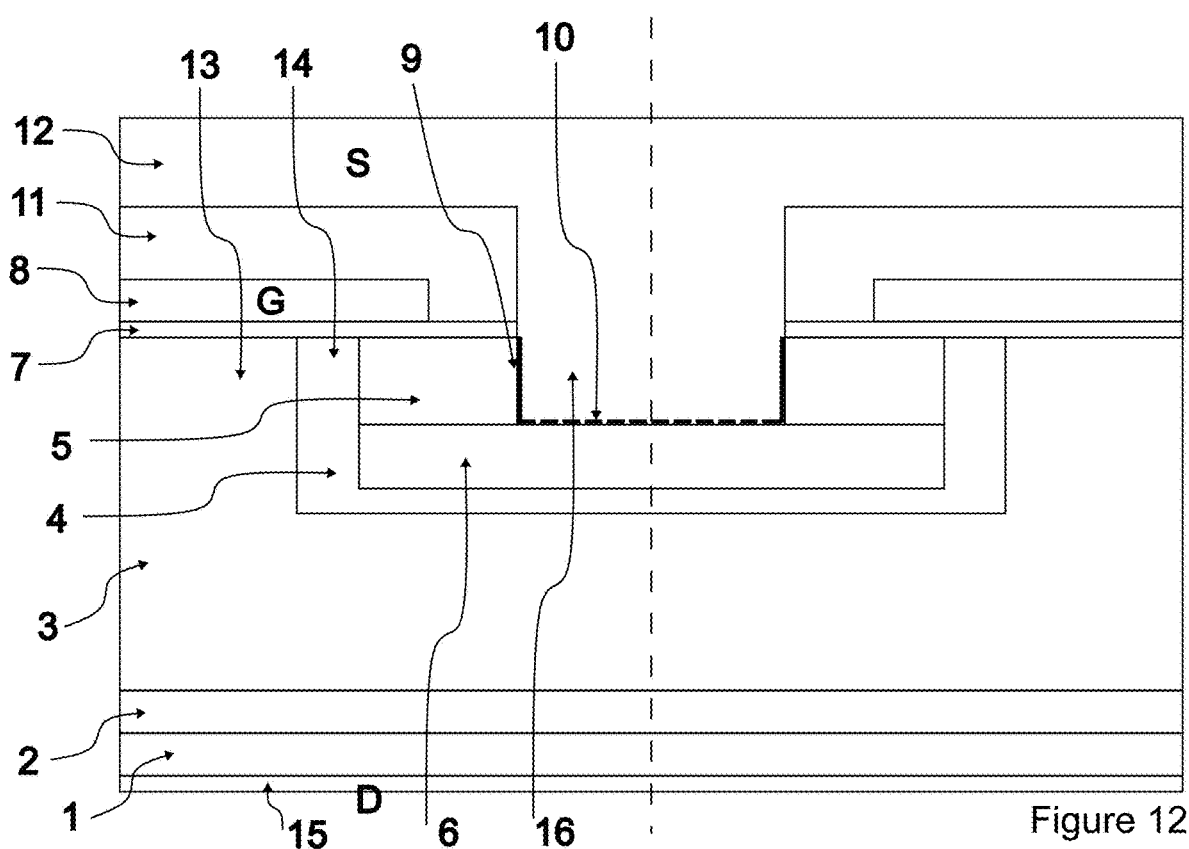
FIG. 12 is a schematic diagram depicting a cross-sectional view of the device after frontside metallization (12) and backside metallization (15).
Figure 13:
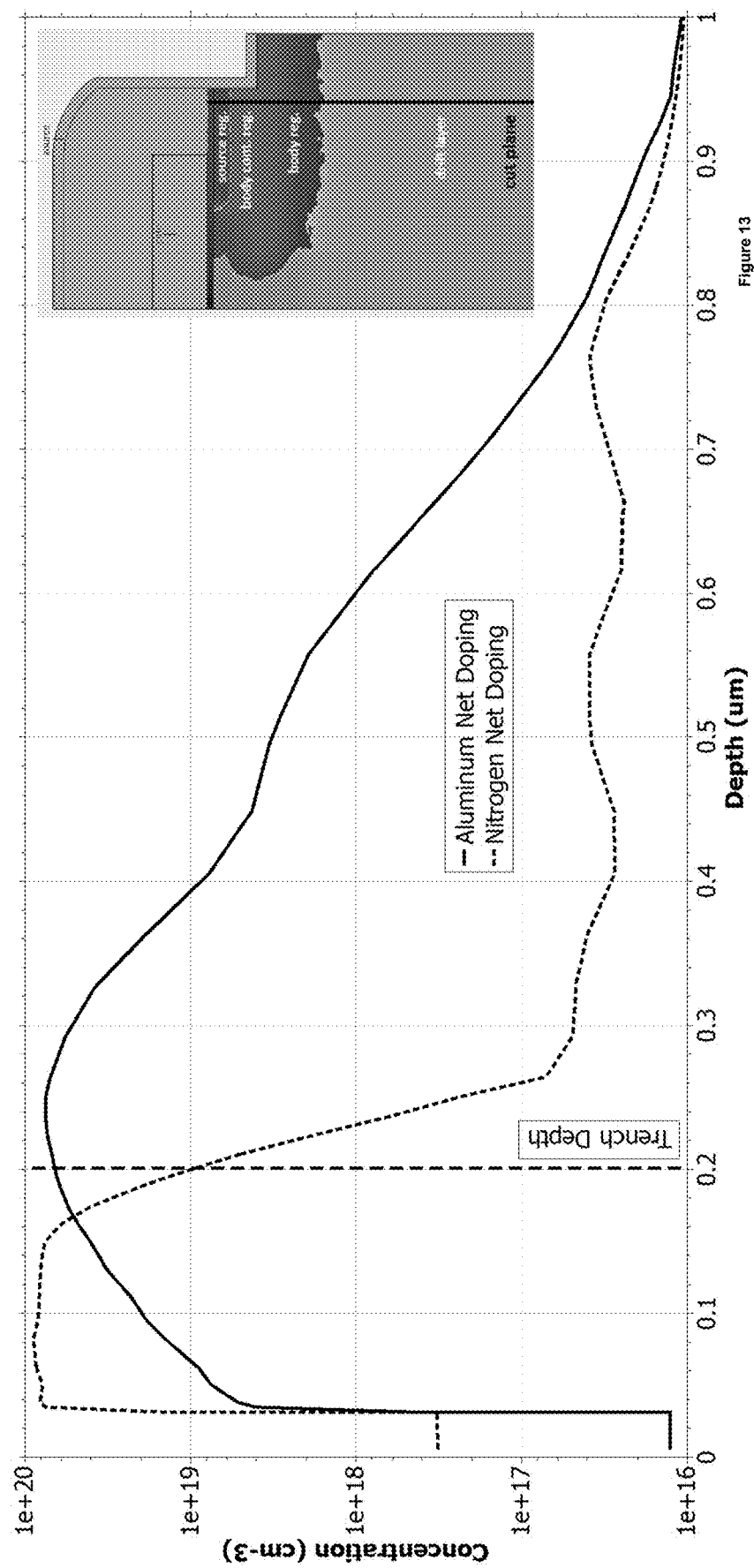
FIG. 13 is an illustration of exemplary doping profiles.

A further step in the method, step 14, involves removing the contact mask and depositing an ohmic metal layer on the top and sidewalls of the interlayer dielectric and on the bottom and sidewalls of the semiconductor trench, as illustrated in FIG. 10. The term "ohmic metal" refers to a metal that forms an ohmic contact with the semiconductor material, enabling current to flow easily in both directions with minimal resistance and without rectification. Achieving an effective ohmic contact is crucial for making efficient, low-resistance connections between the metal electrodes and the semiconductor.

In the scope of the present invention, achieving an ohmic contact depends on factors like the choice of metal, the work function of the metal relative to the semiconductor, the doping level of the semiconductor, and the post-deposition thermal treatment. In one embodiment, nickel and nickel-based alloys are selected for their ability to form reliable ohmic contacts, particularly with silicon carbide.

15. First Contact Annealing Process

A further step, or step 15, of the method is annealing the ohmic metal using a first contact annealing process to alloy it with the semiconductor and to form a self-aligned alloy on the trench bottom and sidewalls.

Annealing the ohmic metal using the first contact annealing process serves to alloy the metal with the underlying semiconductor material, facilitating the formation of a stable and low-resistivity contact. The alloyed metal and semiconductor layer is formed in a self-aligned manner on the trench bottom and sidewalls, meaning that the alloy forms precisely where the metal and semiconductor are in contact, without the need for additional masking or alignment steps. This self-alignment ensures that the alloy is positioned exactly where it is needed.

16. Removal of Unalloyed Metal and Second Annealing Process

A further step, step 16 of the method is removing the unalloyed ohmic metal from the interlayer dielectric and semiconductor, leaving the metal and semiconductor alloy intact, and annealing the metal and semiconductor alloy using a second contact annealing process to achieve final properties of ohmic contacts; source contact defined by an overlap of the alloy with the source region on the sidewalls of the semiconductor trench, body contact defined by an overlap of the alloy with the body contact region on the bottom of the semiconductor trench.

In step 16, the unalloyed ohmic metal is removed from the interlayer dielectric and semiconductor, leaving the metal alloy intact. The remaining metal alloy is then subjected to a second contact annealing process to achieve the final properties of the ohmic contacts. This process defines the source contact by the overlap of the alloy with the source region on the sidewalls of the semiconductor trench, and the body contact by the overlap of the alloy with the body contact region on the bottom of the semiconductor trench. The steps 14-16 together constitute a third self-aligned process, the self-aligned ohmic metal process.

The steps 14-16 require two annealing steps, where the first one is to form the alloy of metal with semiconductor and the second one is to get ohmic contact properties. Between the two annealing steps, the unalloyed metal is removed from the structure there formed. In the invention, the metal alloy is formed on the trench bottom and sidewalls.

17. Final Device Processing

A further step, step 17 of the method, is processing the semiconductor device, including etching a gate contact via, depositing and patterning front side metallization, depositing and patterning passivation, and forming backside metallization.

The process is distinct from prior art, such as that from GeneSiC of comparative example 2, as it enables a smaller device structure by burying the body contact region below the source region in one self-aligned process and by eliminating the ohmic contacts on the semiconductor surface.

18. Continuation with Standard FET Process Flow

Figure 17:
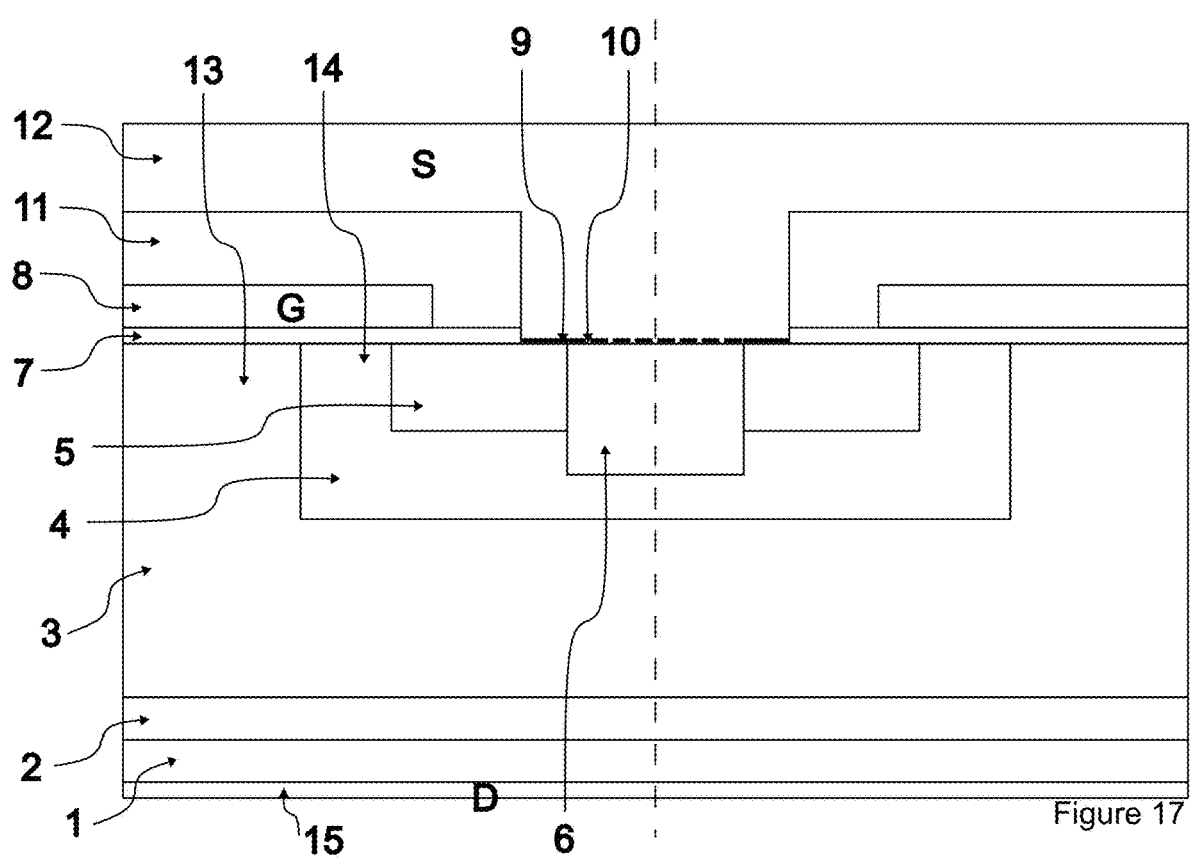
FIG. 17 is a schematic illustration of the basic elementary cell structure of a comparative semiconductor device.
Figure 18:
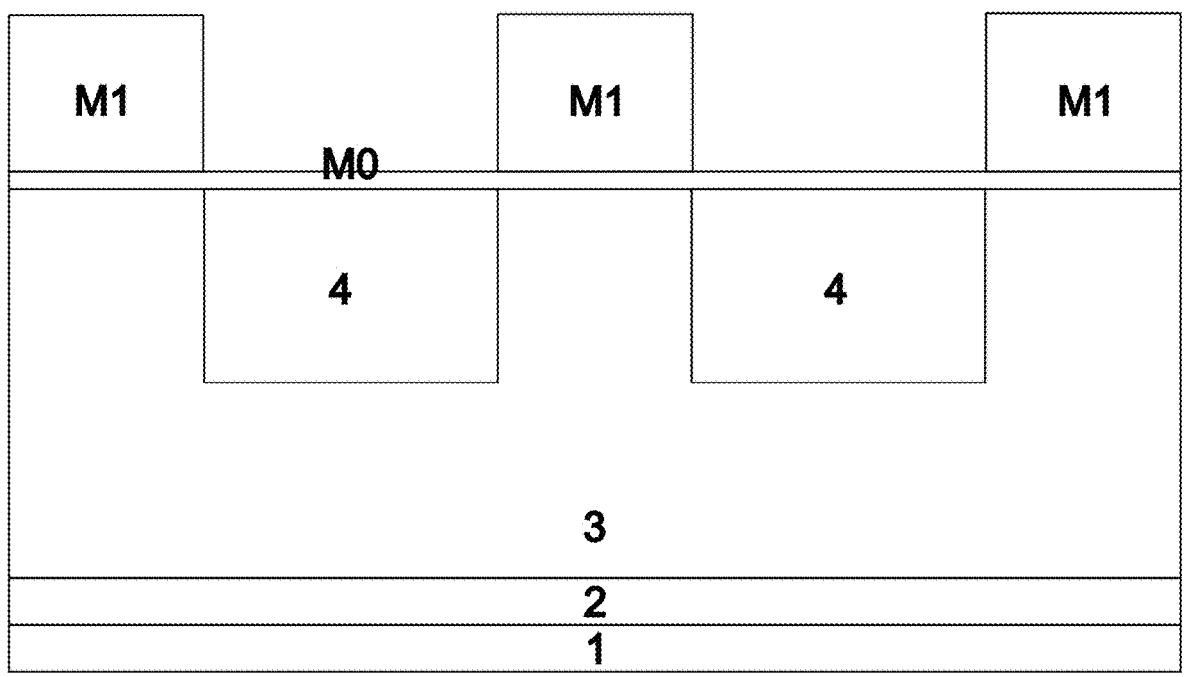
FIGS. 18-22 are schematic diagrams depicting a cross-sectional view showing the formation of the comparative semiconductor device of FIG. 17.
Figure 19:
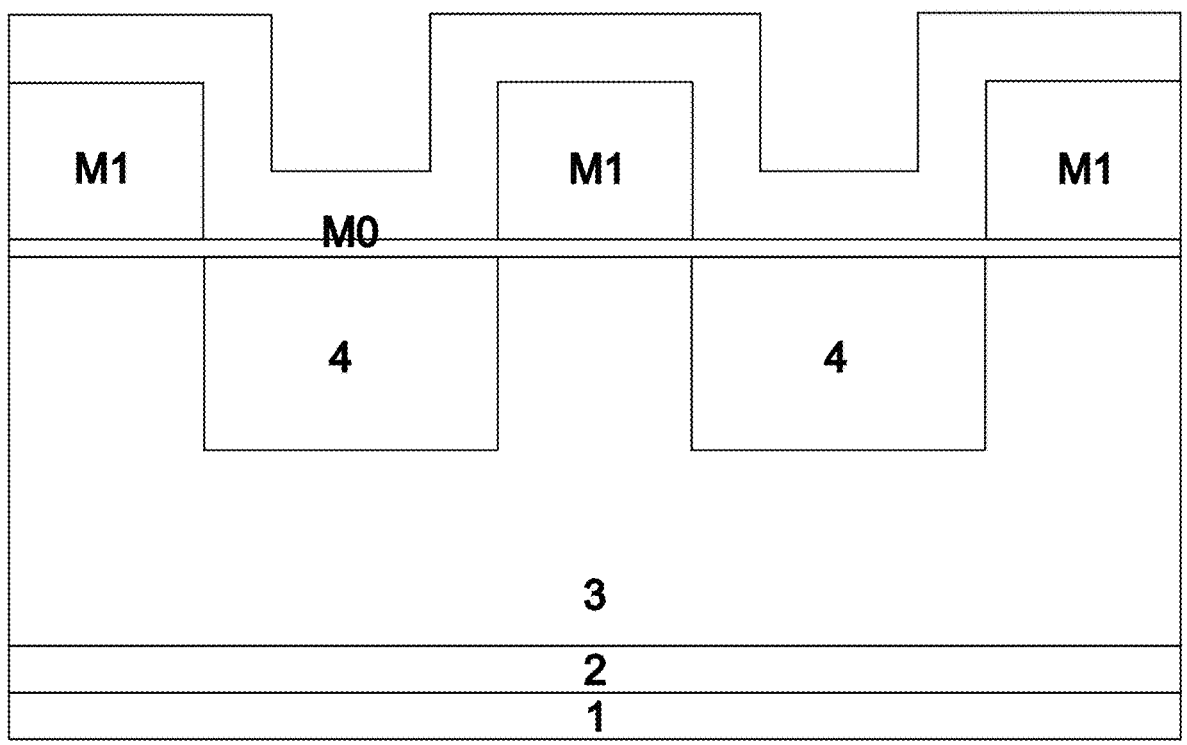
Figure 20:
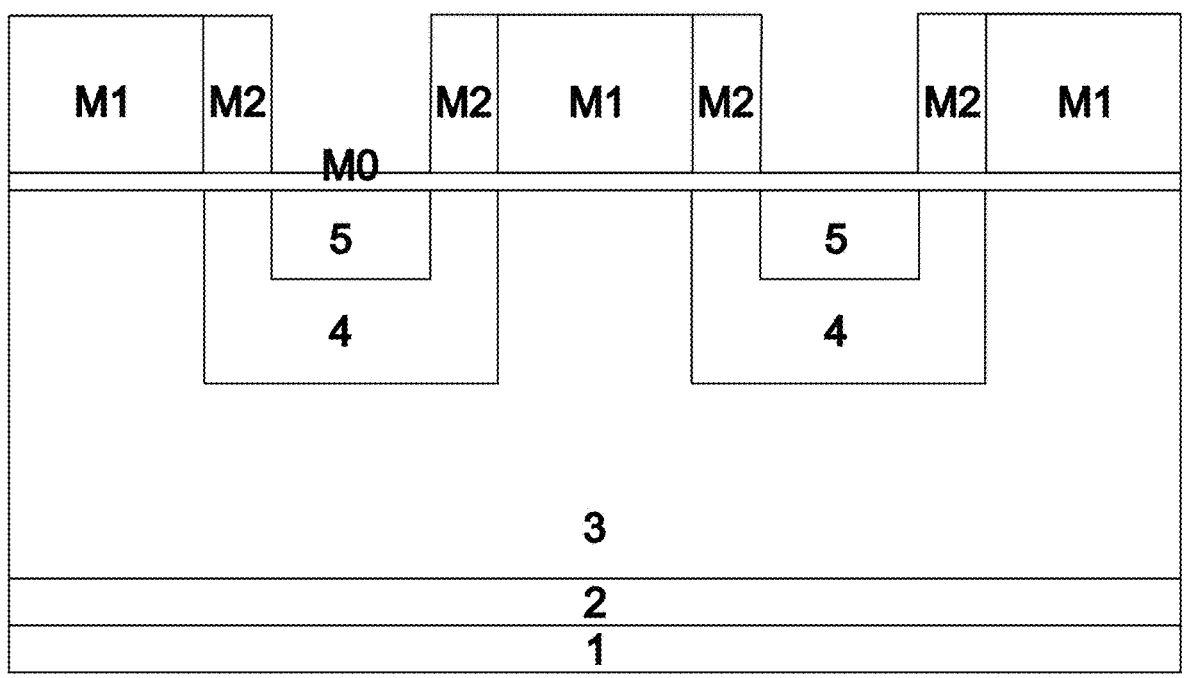
Figure 21:
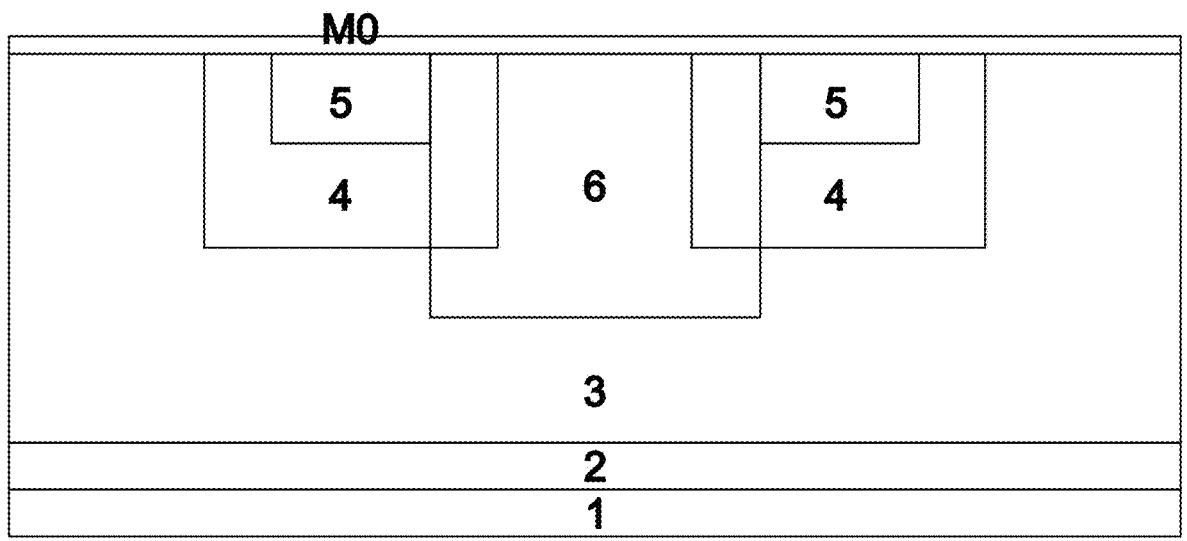
Figure 22:
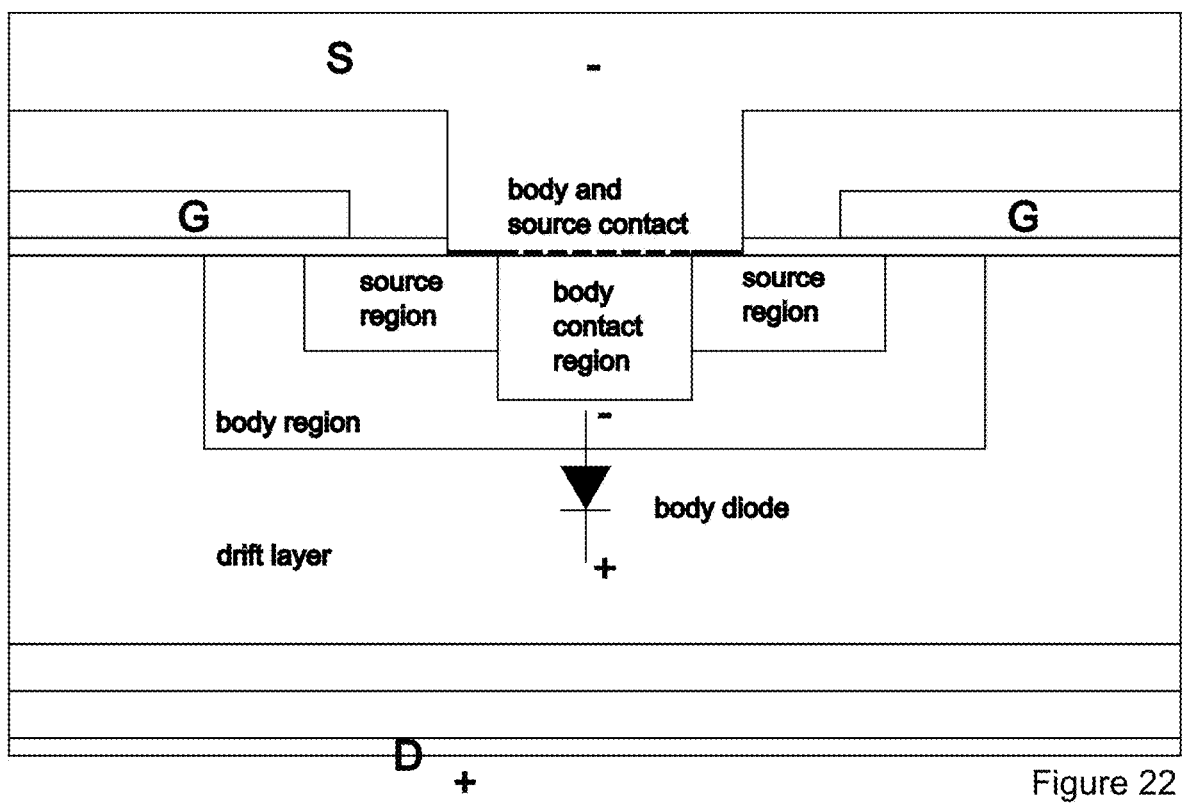

A further step 18 of the method is to continue the process according to the standard FET process flow, including steps such as etching a gate contact via, depositing, and patterning front side metallization (12), depositing and patterning passivation, and forming backside metallization (16), as shown in FIG. 17.

Etching Gate Contact Via

The process begins with etching a gate contact via. This involves precisely removing material to create a pathway that will later be filled with the from side metallization, establishing the electrical connection to the gate of the FET. This step is crucial for defining the control terminal of the transistor, which regulates the flow of current through the device.

Front-Side Metallization

Following the gate contact etching, front-side metallization is carried out. In this step, metal layers are deposited and patterned on the front side of the wafer to form electrical connections to the source and gate.

Passivation

After front-side metallization, passivation layers are deposited. Passivation involves covering the semiconductor surface with protective dielectric layers, which serve multiple purposes: they protect the device from environmental contamination, reduce surface states that could affect device performance, and enhances the overall reliability of the FET.

Backside Metallization

Finally, backside metallization is performed. This step involves depositing a metal layer on the backside of the wafer, which is done to form the drain contact of the FET. The backside metal provides a robust, low-resistance connection, ensuring efficient current flow through the device during operation.

Comparative Example 1, FIGS. 17-21

To more effectively elucidate the present invention and its intricate details, a comparative example 1, an alternative implementation, is provided. This approach serves to highlight the unique aspects of the present invention, providing a clearer understanding of its distinctions and advantages over other possible implementations. Such comparisons facilitate a comprehensive explanation, ensuring that the novelty and distinctiveness of the invention are thoroughly articulated within the context of existing technologies.

Figure 2:
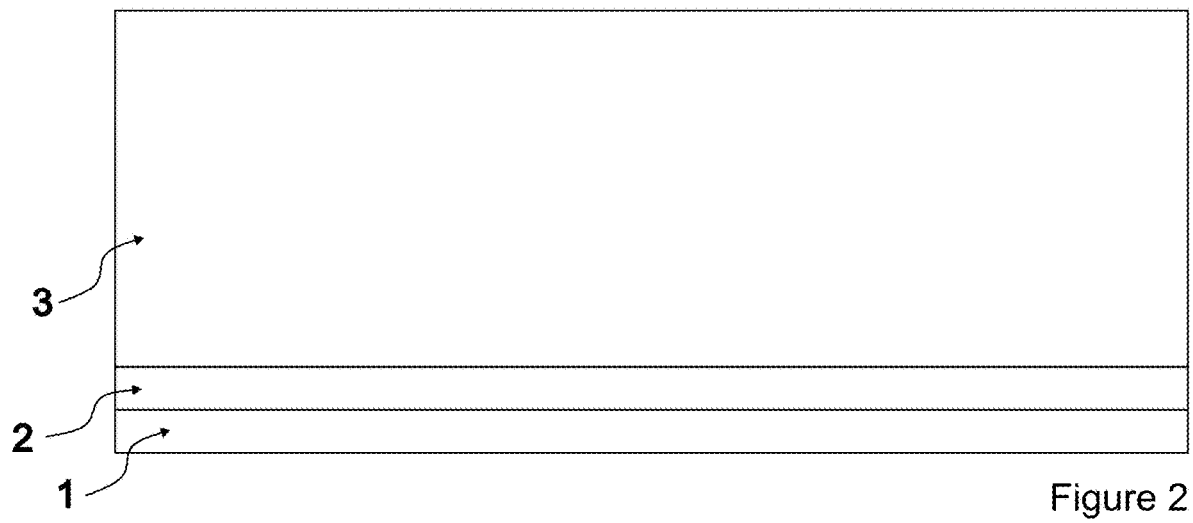
FIG. 2 is a schematic illustration of a structure formed out of an initial substrate for the semiconductor device manufacturing process, beginning with the preparation of a substrate layer (1), followed by the deposition of a buffer layer (2) of the first conductivity doping type, and then the deposition of one or more epitaxial layers (3) of the first conductivity doping type.
Figure 3:
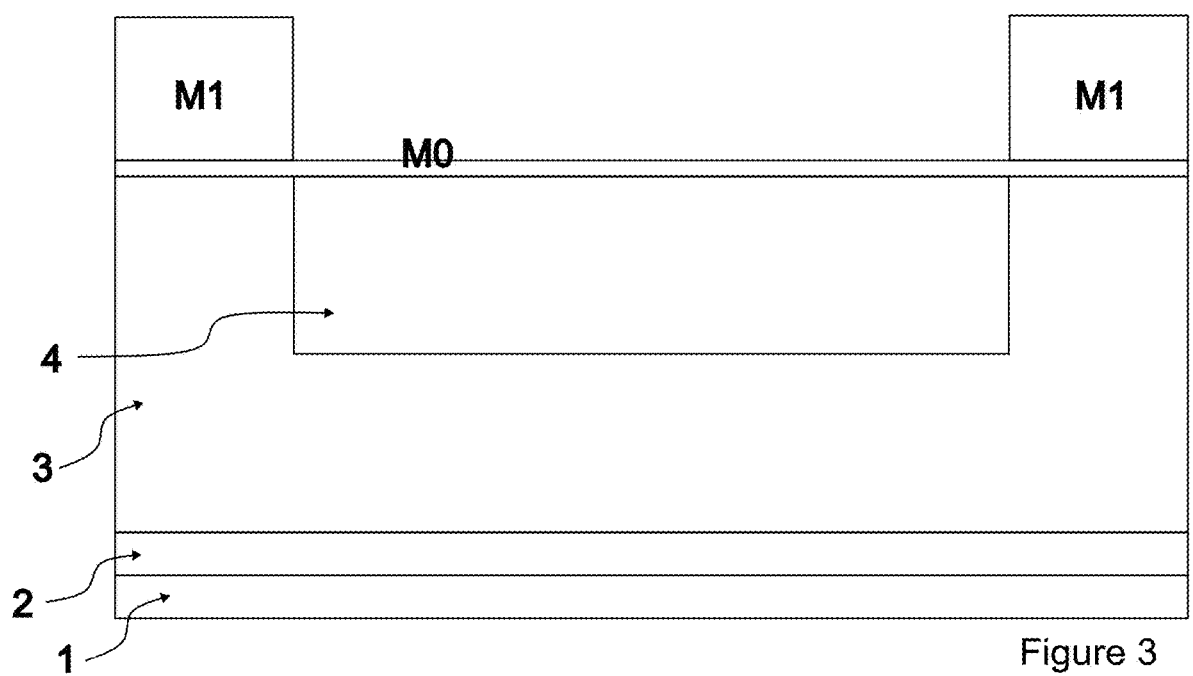
FIG. 3 is a schematic illustration of forming a thin layer (M0) for the adjustment of ion implantation profiles and protection of the topmost epitaxial layer, and of forming a first hard mask (M1) for the selective implantation of a body region with ions of the second conductivity doping type.
Figure 4:
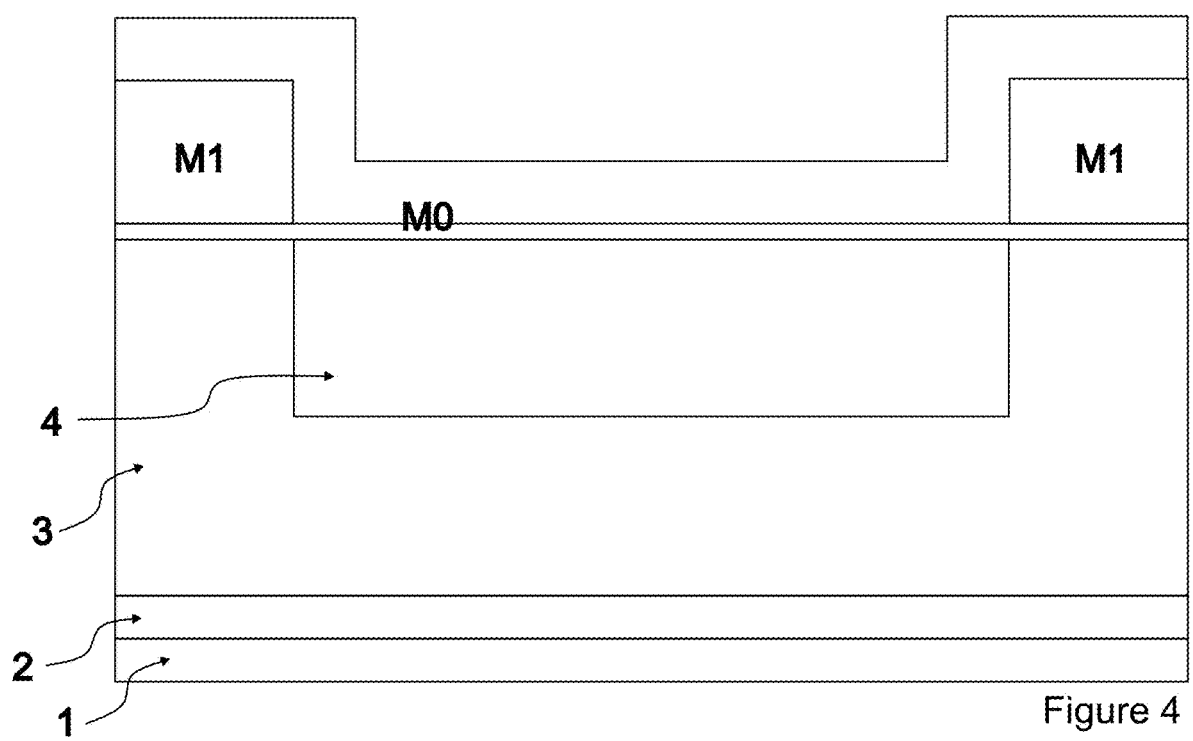
FIG. 4 is a schematic illustration of depositing the second hard mask material on top of the first hard mask (M1) and thin layer (M0).

Referring to the FIGS. 17-2, an example of an alternative self-aligned channel process is described below. A first hard mask material, e.g. polysilicon, silicon dioxide or silicon nitride, is deposited on an epitaxial layer (3) and the mask material is patterned using photolithography in order to produce a first hard mask (M1). Instead depositing the first hard mask material directly on the epitaxial layer, the first hard mask material can be deposited on a thin layer (M0), e.g. silicon dioxide, on top of the topmost epitaxial layer, as presented in FIG. 18. There are two main functions of the layer M0: 1) adjust profiles of implanted ions, 2) protect the topmost epitaxial layer.

The first hard mask is used as a mask for the implantation of the body regions (4). A second hard mask material, e.g. polysilicon, silicon dioxide or silicon nitride, is deposited on top of the first hard mask M1 and the thin layer M0, as presented in FIG. 19. The second hard mask material is deposited using a process with high conformity, i.e. the material thickness in trenches, on mesas and on sidewalls is approximately the same. The second mask material is etched using a dry etching process in order to create a second hard mask (M2) on the sidewalls of the first hard mask, as presented in FIG. 20. A process of creation of the second hard mask is called the spacer process. The first and second hard masks are used as a mask for the implantation of the source region (5). A self-aligned channel is formed between the JFET region (13) and the source region (5) at a shallow depth in the body region (4). During the process, the body contact region (6) is masked from co-implantation with a source region implantation profile. The body contact region (6) can be implanted prior to the self-aligned channel process or after it, as presented in FIG. 21.

Benefits of the Present Invention Over the Comparative Example 1

Despite using the self-aligned channel, the cell pitch of the device described in the comparative example 1 is not only slightly reduced comparing to a device using two independent photolithography layers for the source and body regions (non-self aligned channel device).

Figure 23:
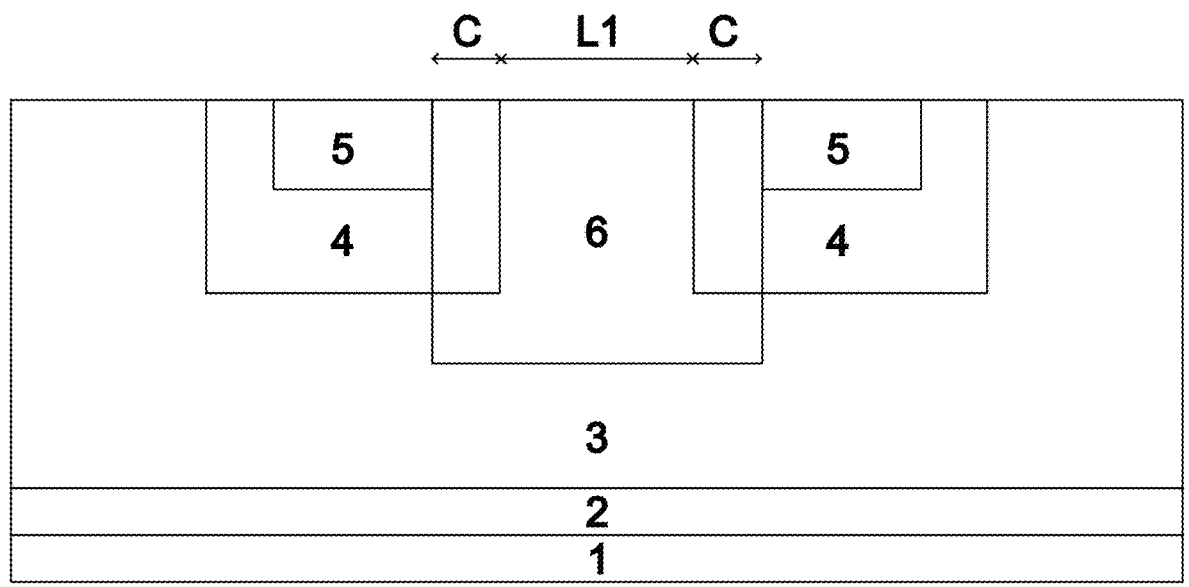
FIG. 23 is a schematic illustration of a minimum spacing between the source regions (5) of the comparative semiconductor device, where the spacing equals a sum of a minimum feature size for the first hard mask M1 (L1) and a double channel length (spacer width, C), spacing=L1+2C.

The cell of the comparative example 1 comprises of the body contact region (6) located between the source regions (5), as presented in FIG. 17. In this configuration during the device fabrication, the body contact region must be masked from co-implantation with the source profile. The masking is done by the hard masks M1 and M2, as presented in FIG. 20, which means that the width of the body contact region (6) being the minimal distance between the source regions (5) is a function of the minimal feature size for the hard mask M1 and the channel length (spacer width). This situation is displayed in FIG. 23, where L1 is the minimal feature size for the hard mask, M1, C is the channel length, and L1+2C is the distance between the source regions (5). While the minimum feature size for the hard mask M1 is a photolithography-dependent fixed value, the channel length is a variable. The fabrication process used by the comparative example 1 might be suitable for short channel lengths, however for longer channels the method is not useful, as it results wide spacings between the source regions and consequently in long cell pitches.

Figure 24:
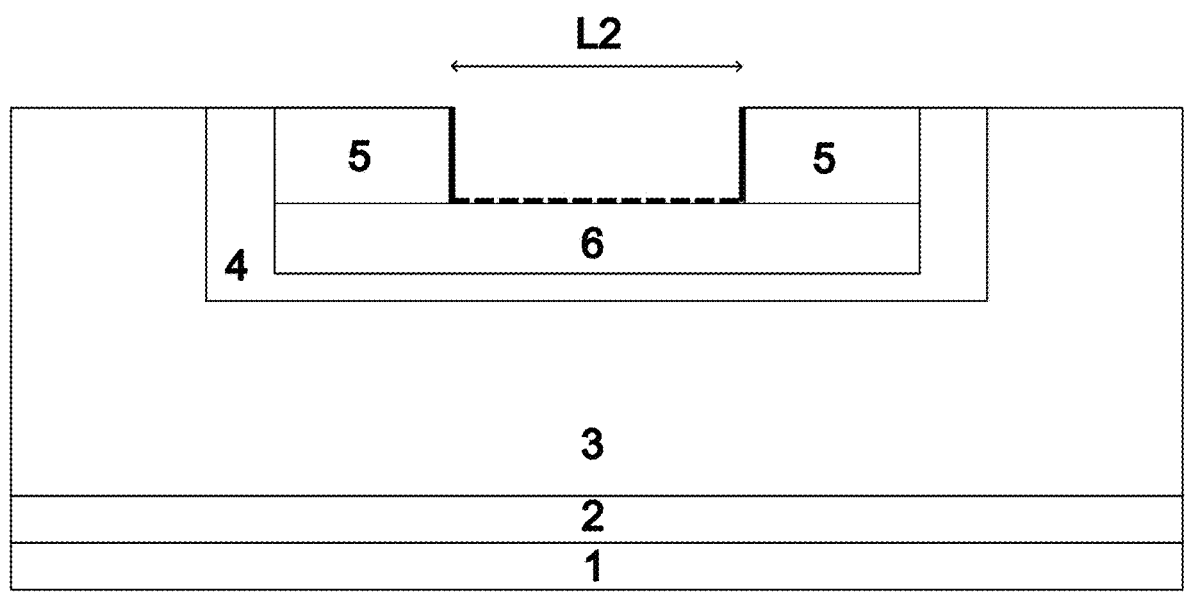
FIG. 24 is a schematic illustration of a minimum spacing between the source regions (5) of the invented semiconductor device, where the spacing equals the minimum feature size L2 for the trench and ohmic metal processes, L2 being significantly smaller than L1+2C.

Advantage of the self-aligned processes in the present invention is that the body contact region is buried below the source region and it does not increase the cell pitch for any applied channel length. The distance between the source regions (5) depends solely on the minimal feature size for the trench etching process and on the ohmic metal process. This distance, noted in FIG. 24 as L2, is much smaller than the distance between the source regions defined for the comparative example 1; L2<L1+2C.

Comparative example 2, structure from GeneSiC, US11049962B2, US10916632B2

A device disclosed in US11049962B2 and US10916632B2 shares some similarities with the present invention. It is planar-gate device (a channel is oriented parallel to the semiconductor surface) with a self-aligned channel, which incorporates a trench and a body contact region (p-type sinker #1) below the trench bottom. The function of the p-type sinker #1 is to improved the avalanche ruggedness. However, the fabrication method of this device and the resulting structures are different than for the present invention. The comparative example 2 comprises of three independently implanted p-type regions. The p-type inker #1 below the trench is implanted below the trench after the trench etching, which means that its width is the same as the width of the trench. The p-type sinker #1 is not aligned with the source region nor with the body region. In addition, for all embodiments, there is a source contact present on the top semiconductor surface.

The advantage of the invention over the comparative example 2 is no presence of the source contact on the top semiconductor surface, which results in a smaller cell pitch. In addition, the invented fabrication method uses less fabrication due to three self-aligned processes, particularly due to the body contact region self-aligned on the source region. While the comparative example #2 focuses on the avalanche ruggedness, the main scope of the invention is to get a possible smallest pitch of the elementary cell.

Device Structure

On the second aspect of the present invention, a semiconductor device is disclosed, which includes a planar Metal-Oxide-Semiconductor Field-Effect Transistor (MOSFET) and an Insulated Gate Bipolar Transistor (IGBT).

In the scope of the present invention, the semiconductor device is a cell. It may further comprise neighboring cells. The terms cell, elementary cell, device and structure are used interchangeably.

The semiconductor device comprises a substrate (1), which serves as the foundational layer.

A buffer layer (2) of a first conductivity doping type is formed on top of the substrate (1).

One or more epitaxial layers (3) of the first conductivity doping type, r positioned atop the buffer layer (2).

A body region (4) of a second conductivity doping type, is formed within the topmost layer and serves as a critical region for channel formation.

A source region (5) of the first conductivity doping type, is placed within the body region (4).

A body contact region (6) of the second conductivity doping type is buried below the source region (5) to reduce the semiconductor device pitch.

A trench (16) is formed within the source region (5), making direct electrical access to the underlying body contact region (6) while maintaining a width that is narrower than that of the body contact region (6).

An ohmic contact forming a source contact (9), overlaps the source region on the sidewalls of the trench.

At ohmic contact forming a body contact (10), overlaps the body contact region (6) at the trench bottom.

A Junction Field-Effect Transistor (JFET) region (13) is formed between the body regions (4) of the neighboring cells.

A self-aligned channel (14) is formed between the source region (5) and the JFET region (13) at a shallow depth in the body region (4). The channel opens or closes the electrical current path between the source electrode and the drain electrode, controlling device operation. The source region (5) and the body contact region (6) exhibit identical widths.

Furthermore, the semiconductor device comprises a gate insulator (7) and a gate (8). The gate insulator (7) and the gate (8) are placed above a portion of the body region (4) and a portion of the source region (5), and above the entire JFET region (13), effectively controlling the carrier concentration in the channel and thus the operation of the device.

Additionally, the cell further comprises an interlayer dielectric (11), which separates the gate (8) from the source contact (9). This dielectric layer provides crucial electrical isolation between the gate and source contacts, preventing an excessive leakage current and ensuring device reliability.

Moreover, a top metallization layer (12) is positioned above the interlayer dielectric (11). This metallization layer is electrically connected to both the source contact (9) and the body contact (10), collectively functioning as the source electrode (S). The top metallization provides a robust and low-resistance pathway for current flow, which is essential for the effective operation of the semiconductor device.

Additionally, a bottom metallization layer (15) is provided, which serves as the drain electrode (D). This bottom metallization layer establishes the necessary connection to the semiconductor substrate. The gate (8) itself acts as the gate electrode (G), completing the three-terminal configuration of the MOSFET/IGBT device. The proper formation and placement of these metallization layers are critical for ensuring device efficiency and reliability.

Further, in the semiconductor device of the present invention, the source region (5) and the body contact region (6) are formed using a self-aligned process in conjunction with the body region (4). The self-aligned nature of this process ensures that the source region (5) and the body contact region (6) are precisely aligned with the body region (4) and their widths are identical.

Moreover, in the semiconductor device of the present invention, the trench (16) can be formed such that it indents into the body contact region (6). The source contact (9) is positioned on the trench (16) sidewalls on the source region (5), while the body contact (10) is located on the trench (16) sidewalls and bottom on the body contact region (6).

In one embodiment of the semiconductor device, the substrate, buffer layer, and one or more epitaxial layers are composed of silicon carbide (SiC), a material known for its excellent thermal conductivity and high critical field. The first conductivity doping type ions are nitrogen (N) or phosphorus (P), which are selected for their ability to donate electrons and thereby create n-type regions within the silicon carbide. The second conductivity doping type ion is aluminum (Al), chosen for its ability to accept electrons and create p-type regions. The ohmic contacts, crucial for low-resistance electrical connections, are formed from materials such as nickel (Ni), titanium (Ti), aluminum (Al), or their compounds.

In another embodiment of the semiconductor device, the substrate, buffer layer, and one or more epitaxial layers are also composed of silicon carbide (SiC). However, in this embodiment, the first conductivity doping type ion is aluminum (Al), used to create p-type regions, while the second conductivity doping type ions are nitrogen (N) or phosphorus (P), which create n-type regions. The ohmic contacts are similarly formed from materials such as nickel (Ni), titanium (Ti), aluminum (Al), or their compounds, ensuring low-resistance electrical paths.

Further, in one instance, the body region (4) is characterized by a depth of at least 0.4 micrometers (um) and exhibits a peak doping concentration ranging between $5e17$ $cm^{-3}$ and $1e19$ $cm^{-3}$.

Further, in another instance, the source region (5) is characterized by a depth of at least 0.1 micrometers (um) and has a peak doping concentration ranging between $1e19$ $cm^{-3}$ and $1e21$ $cm^{-3}$.

Figure 14:
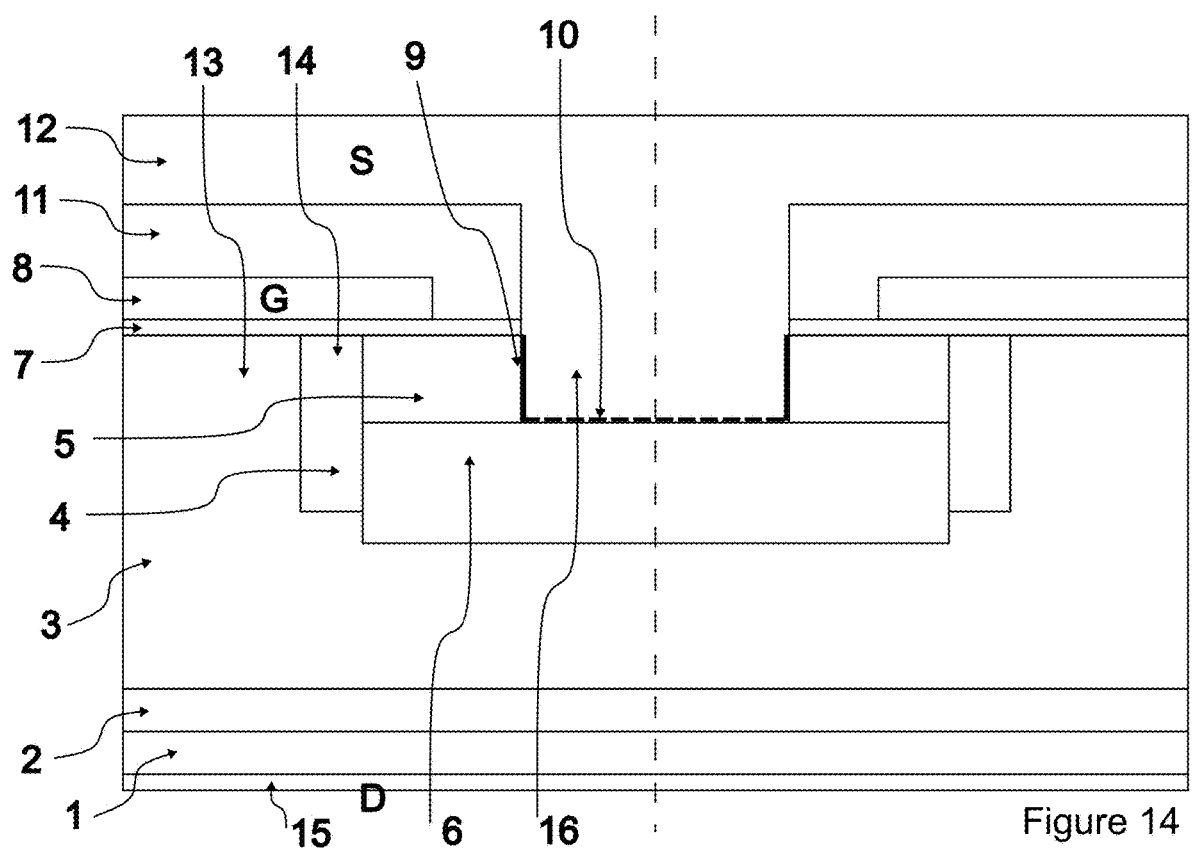
FIG. 14 is an illustration showing that the body contact region (6) can be deeper than the body region (4).

Further, in yet another instance, the body contact region (6), which is buried below the source region (5), is characterized by a depth of at least 0.1 micrometers (um) from the junction between the body contact region and the source region, with a peak doping concentration ranging between $1e19$ $cm^{-3}$ and $1e21$ $cm^{-3}$. This precise doping profile is necessary to ensure effective ohmic contact formation:

Referring to FIG. 14, in one embodiment, the depth of the body contact region (6) is bigger than the depth of the body region (4).

Figure 15:
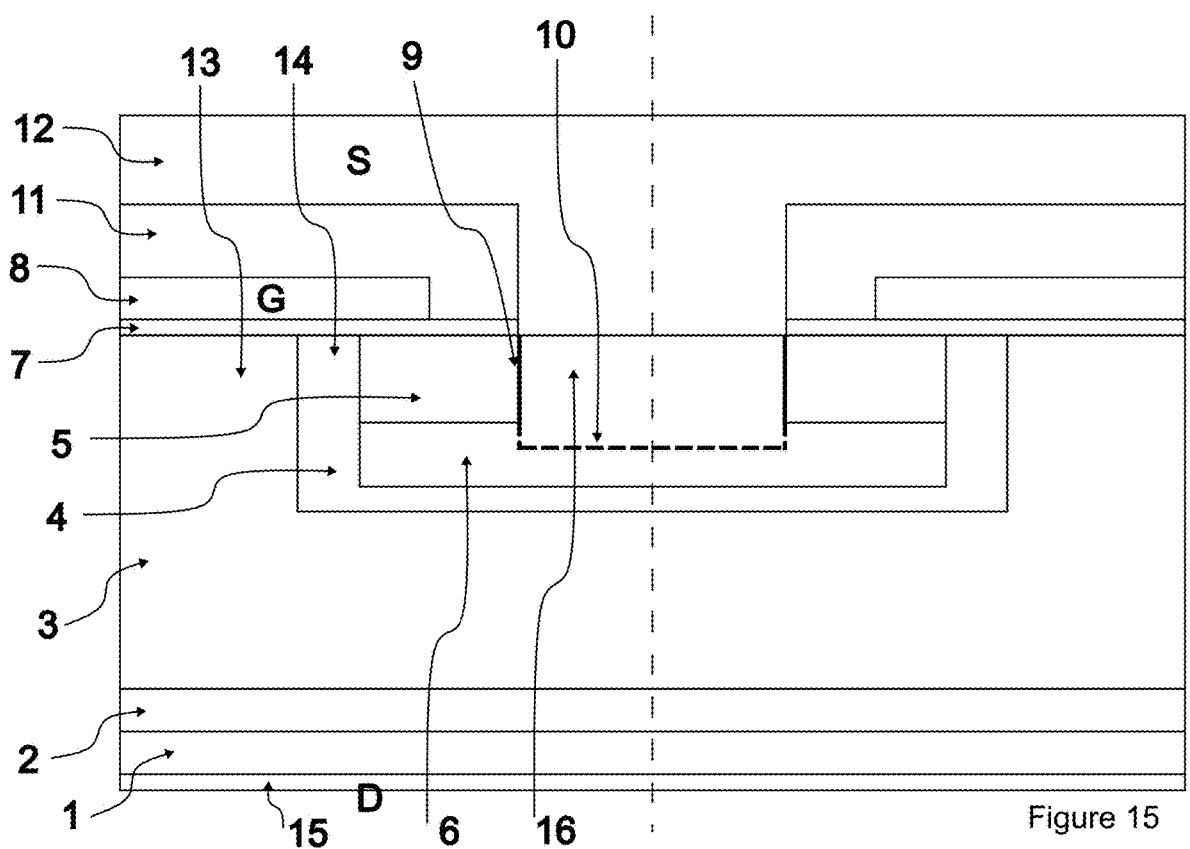
FIG. 15 is a schematic illustration of a trench (16) indenting into the body contact region (6), dividing the source region (6) into two parts, where the body contact (10) is located on the bottom and sidewalls of the semiconductor trench (16).

Referring to FIG. 15, in one embodiment, wherein the trench indents into the body contact region (6), the source contact (9) is located on the source region (5) on the trench (16) sidewalls, the body contact (10) is located on the body contact region (6) on the trench (16) sidewalls and bottom.

Figure 16:
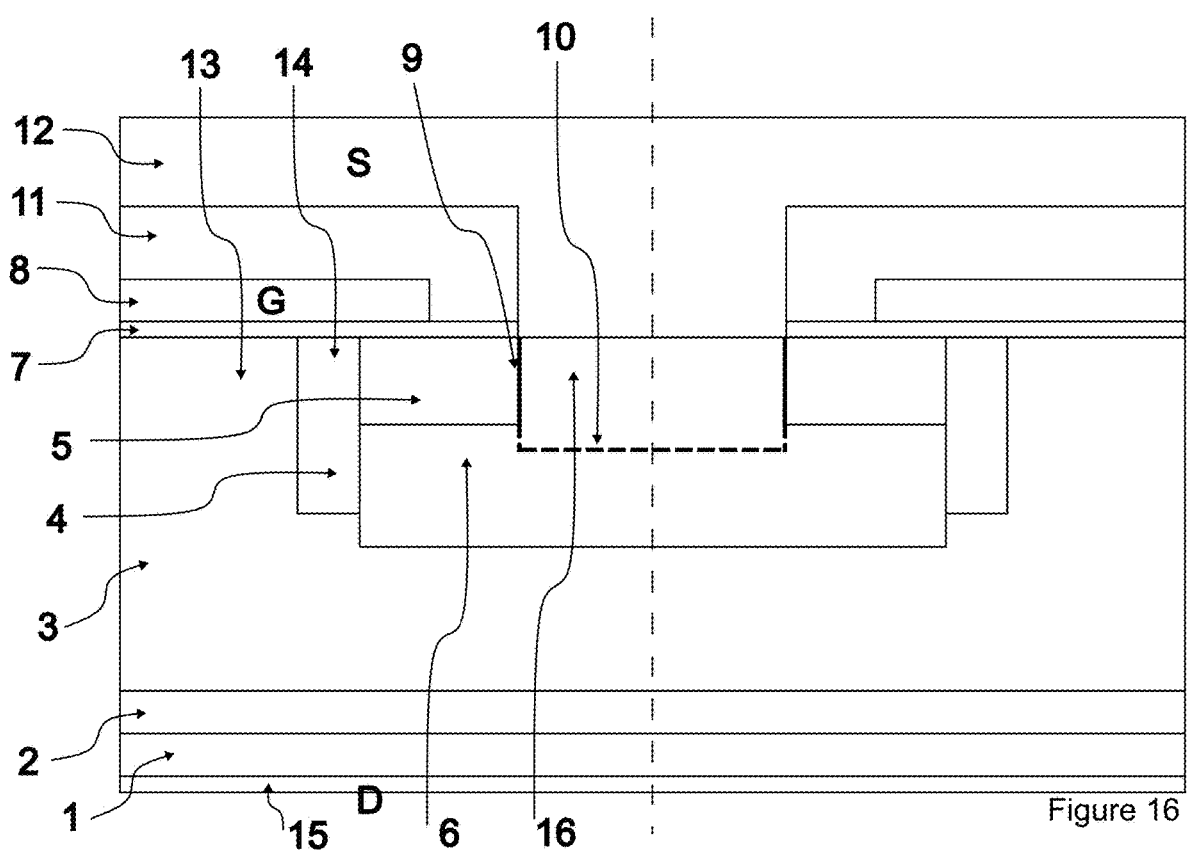
FIG. 16 is a schematic illustration showing that the trench (16) can indent into the body contact region (6), whose depth is bigger than the depth of the body region (4).

Lastly, in one embodiment, referring to FIG. 16, the trench (16) indents into the body contact region (6) and the depth of the body contact region (6) is bigger than the depth of the body region (4).

The device structure of the present invention offers significant and multifaceted advantages. Firstly, due to the shift of the body contact region below the source region and elimination of the source contacts from the top semiconductor surface, the cell pitch is reduced, which allows for reduction of the resistance of an integrated circuit or for usage of smaller semiconductor area for device fabrication. Secondly utilization of three self-aligned processes reduces complexity and the number of fabrication steps, which decreases the total device cost. The self-aligned processes due to their reproducibility can enhance the yield and device reliability. For one embodiment presenting a structure with a body contact region deeper than the body region, the avalanche ruggedness will be improved and the number of process steps will be further reduced, if the same implantation profile used for the body contact region and for the edge termination of the device.

Obviously, the above-mentioned embodiments are only examples for clearly illustrating the present invention, and are not intended to limit the implementations. A person with ordinary skill in the art may further make other changes or variations in a different form on the basis of the above description. Herein, examples are unnecessarily provided for all implementation manners. However, the obvious changes or modifications derived from this are still within the protection scope of the present invention.

The invention claimed is:

1. A method to make a semiconductor device having a source region self-aligned with a body region and a body contact region self-aligned with the body region, comprising
   1) providing a semiconductor substrate;
   2) depositing a semiconductor buffer layer of a first conductivity doping type on the semiconductor substrate;
   3) depositing one or more semiconductor epitaxial layers of the first conductivity doping type on the buffer layer and forming a drift layer;
   4) forming through depositing or growing a thin layer (M0) on a topmost epitaxial layer, wherein the said thin layer (M0) is configured to adjust profiles of implanted ions and to protect the topmost epitaxial layer;
   5) depositing and patterning a first hard mask material to produce a first hard mask (M1), wherein the first hard mask has a thickness to block the implanted ions;
   6) forming a body region of a second conductivity doping type by ion implantation, using the first hard mask (M1) as a mask; and forming Junction Field-Effect Transistor (JFET) regions between the body regions of neighboring cells;
   7) depositing a second hard mask material on top of the first hard mask (M1) and the thin layer (M0);
   8) etching the second hard mask material to create a second hard mask (M2) as a spacer mask on sidewalls of the first hard mask (M1), a width of the spacer mask equals a thickness of the deposited second hard mask material;
   9) forming a source region of the first conductivity doping type by ion implantation, using the first hard mask (M1) and the second hard mask (M2), making the source region self-aligned with the body region, creating a channel between the JFET region and the source region at a shallow depth in the body region;
   10) forming a body contact region of the second conductivity doping type by ion implantation, wherein the body contact region and the source region are vertically aligned, each being laterally positioned in accordance with inner edges of the second hard mask (M2); wherein the channel between the JFET region and the source region in the body region is vertically aligned with second hard mask (M2), said vertical alignments are achieved essentially through the use of the first hard mask (M1) and the second hard mask (M2);
   11) removing the thin layer (M0), the first hard mask (M1) and the second hard mask (M2) by wet etching or dry etching with high selectivity to the semiconductor material;
   12) activating the implanted ions, forming a gate insulator, forming a gate and forming an interlayer dielectric enclosing the gate;
   13) etching an ohmic contact via in the interlayer dielectric using a contact mask and using the same contact mask to etch a trench in the source region to access the body contact region;
   14) removing the contact mask and depositing an ohmic metal layer on top and sidewalls of the interlayer dielectric and on bottom and sidewalls of the semiconductor trenches;
   15) annealing the ohmic metal using a first contact annealing process to form a self-aligned metal and semiconductor alloy on the trench bottom and sidewalls;
   16) removing the unalloyed ohmic metal from the interlayer dielectric and semiconductor, leaving the metal and semiconductor alloy intact, and annealing the metal and semiconductor alloy using a second contact annealing process to achieve final properties of ohmic contacts; source contact defined by an overlap of the alloy with the source region on the sidewalls of the semiconductor trenches, body contact defined by an overlap of the alloy with the body contact region on the bottom of the semiconductor trenches;
   17) processing the semiconductor device, including etching a gate contact via, depositing and patterning front side metallization, depositing and patterning passivation, and forming backside metallization.

2. The method of claim 1, wherein the substrate is selected from silicon carbide, silicon, gallium nitride, gallium oxide, diamond or aluminum nitride.

3. The method of claim 2, wherein the substrate has a first conductivity doping type, which is the same as the doping type of the buffer layer and the one or more semiconductor epitaxial layers.

4. The method of claim 2, wherein the substrate has a second conductivity doping type, which is opposite to the doping type of the buffer layer and the one or more semiconductor epitaxial layers.

5. The method of claim 1, wherein the first hard mask material and the second hard mask material are selected from a group consisting of silicon dioxide, silicon nitride and polysilicon, or any combination of them.

6. The method of claim 1, further comprising controlling a width of the spacer by controlling a thickness of the deposited second hard mask material, controlling the channel length by the spacer width.

7. The method of claim 1, wherein the body contact region is buried below the source region, wherein the implantation of the body contact region does not affect the electrical properties of the source contact on the source region.

8. The method of claim 1, further comprising forming the trench narrower than the body contact region.

9. The method of claim 1, wherein the substrate, buffer layer and epitaxial layers are silicon carbide, the first conductivity doping type ions are nitrogen or phosphorous, the second conductivity doping type ion is aluminum and the ohmic metal is nickel, aluminum, titanium or their compounds.

10. The method of claim 1, wherein the substrate, buffer layer and epitaxial layers are silicon carbide, the first conductivity doping type ion is aluminum, the second conductivity doping type ions are nitrogen or phosphorous and the ohmic metal is nickel, aluminum, titanium or their compounds.

* * * * *